United States Patent
Le et al.

(10) Patent No.: US 12,125,512 B2
(45) Date of Patent: *Oct. 22, 2024

(54) DOPING PROCESS TO REFINE GRAIN SIZE FOR SMOOTHER BiSb FILM SURFACE

(71) Applicant: Western Digital Technologies, Inc., San Jose, CA (US)

(72) Inventors: Quang Le, San Jose, CA (US); Cherngye Hwang, San Jose, CA (US); Brian R. York, San Jose, CA (US); Randy G. Simmons, San Jose, CA (US); Xiaoyong Liu, San Jose, CA (US); Kuok San Ho, Emerald Hills, CA (US); Hisashi Takano, San Jose, CA (US); Michael A. Gribelyuk, San Jose, CA (US); Xiaoyu Xu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 141 days.

This patent is subject to a terminal disclaimer.

(21) Appl. No.: 17/854,568

(22) Filed: Jun. 30, 2022

(65) Prior Publication Data

US 2023/0197132 A1 Jun. 22, 2023

Related U.S. Application Data

(60) Provisional application No. 63/292,582, filed on Dec. 22, 2021.

(51) Int. Cl.
*G11C 11/16* (2006.01)
*G01R 33/09* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC .............. G11C 11/161; G11C 11/1673; G11C 11/1675; H10B 61/00; H01N 52/01;
(Continued)

(56) References Cited

U.S. PATENT DOCUMENTS

| 5,751,521 A | 5/1998 | Gill |
| 6,657,823 B2 | 12/2003 | Kawato |

(Continued)

FOREIGN PATENT DOCUMENTS

| CN | 111354392 A | 6/2020 |
| JP | 4934582 B2 | 5/2012 |

(Continued)

OTHER PUBLICATIONS

"A colossal breakthrough for topological spintronics," Tokyo Institute of Technology, Jul. 31, 2018, 4 pages, <https://www.titech.ac.jp/english/news/2018/042001.html>.

(Continued)

*Primary Examiner* — Ly D Pham
(74) *Attorney, Agent, or Firm* — PATTERSON + SHERIDAN, LLP

(57) ABSTRACT

The present disclosure generally relates to spin-orbit torque (SOT) magnetic tunnel junction (MTJ) devices comprising a doped bismuth antimony (BiSbE) layer having a (012) orientation. The devices may include magnetic write heads, read heads, or MRAM devices. The dopant in the BiSbE layer enhances the (012) orientation. The BiSbE layer may be formed on a texturing layer to ensure the (012) orientation, and a migration barrier may be formed over the BiSbE layer to ensure the antimony does not migrate through the (Continued)

structure and contaminate other layers. A buffer layer and interlayer may also be present. The buffer layer and the interlayer may each independently be a single layer of material or a multilayer of material. The buffer layer and the interlayer inhibit antimony (Sb) migration within the doped BiSbE layer and enhance uniformity of the doped BiSbE layer while further promoting the (012) orientation of the doped BiSbE layer.

23 Claims, 19 Drawing Sheets

(51) Int. Cl.
*G11B 5/39* (2006.01)
*H10B 61/00* (2023.01)
*H10N 50/10* (2023.01)
*H10N 50/85* (2023.01)
*H10N 52/00* (2023.01)
*H10N 52/01* (2023.01)
*H10N 52/80* (2023.01)

(52) U.S. Cl.
CPC ............. *H10B 61/00* (2023.02); *H10N 50/10* (2023.02); *H10N 50/85* (2023.02); *H10N 52/00* (2023.02); *H10N 52/01* (2023.02); *H10N 52/80* (2023.02)

(58) Field of Classification Search
CPC ........ H01N 52/00; H01N 52/80; H01N 50/85; H01N 50/10
USPC ........................................................ 365/158
See application file for complete search history.

(56) References Cited

U.S. PATENT DOCUMENTS

| | | |
|---|---|---|
| 6,667,861 B2 | 12/2003 | Gill |
| 6,680,828 B2 | 1/2004 | Gill |
| 6,906,898 B2 | 6/2005 | Kawato |
| 7,016,160 B2 | 3/2006 | Mao et al. |
| 7,242,556 B2 | 7/2007 | Gill |
| 7,298,595 B2 | 11/2007 | Gill |
| 7,436,632 B2 | 10/2008 | Li et al. |
| 7,643,255 B2 | 1/2010 | Gill et al. |
| 7,697,242 B2 | 4/2010 | Gill |
| 7,881,018 B2 | 2/2011 | Gill et al. |
| 8,125,746 B2 | 2/2012 | Dimitrov et al. |
| 8,174,799 B2 | 5/2012 | Hoshiya et al. |
| 8,223,464 B2 | 7/2012 | Yasui et al. |
| 8,553,346 B2 | 10/2013 | Braganca et al. |
| 8,570,677 B2 | 10/2013 | Braganca et al. |
| 8,570,689 B2 | 10/2013 | Sato et al. |
| 8,654,465 B2 | 2/2014 | Braganca et al. |
| 9,472,216 B1 | 10/2016 | Mauri et al. |
| 9,806,710 B2 | 10/2017 | Flatte |
| 9,929,210 B2 | 3/2018 | Lai et al. |
| 9,947,347 B1 | 4/2018 | Van Der Heijden et al. |
| 10,014,012 B1 | 7/2018 | Song et al. |
| 10,127,933 B2 | 11/2018 | Batra et al. |
| 10,210,888 B1 | 2/2019 | Li et al. |
| 10,483,457 B1 | 11/2019 | Lee et al. |
| 10,490,731 B2 | 11/2019 | Sasaki et al. |
| 10,720,570 B2 | 7/2020 | Le et al. |
| 10,839,831 B1 | 11/2020 | Nguyen et al. |
| 10,867,626 B1 | 12/2020 | Li et al. |
| 10,991,390 B2 | 4/2021 | Kobayashi |
| 11,088,200 B1 | 8/2021 | Xiao |
| 11,094,338 B1 | 8/2021 | Hwang et al. |
| 11,100,946 B1 | 8/2021 | Le et al. |
| 11,222,656 B1 | 1/2022 | Le et al. |
| 11,495,741 B2 | 11/2022 | York et al. |
| 11,532,323 B1 | 12/2022 | Le et al. |
| 2011/0089940 A1 | 4/2011 | Carey et al. |
| 2014/0226239 A1 | 8/2014 | Mihajlovic et al. |
| 2014/0254252 A1 | 9/2014 | Guo |
| 2015/0041934 A1 | 2/2015 | Khvalkovskiy et al. |
| 2015/0287426 A1 | 10/2015 | Mihajlovic et al. |
| 2017/0077392 A1 | 3/2017 | Han et al. |
| 2017/0098545 A1 | 4/2017 | Woodruff |
| 2017/0221506 A1 | 8/2017 | Tan et al. |
| 2017/0271581 A1 | 9/2017 | Seong et al. |
| 2017/0288666 A1 | 10/2017 | Flatte |
| 2017/0365777 A1 | 12/2017 | Mihajlovic et al. |
| 2018/0166500 A1 | 6/2018 | Wang et al. |
| 2018/0358543 A1 | 12/2018 | Le et al. |
| 2018/0366172 A1 | 12/2018 | Wang et al. |
| 2019/0037703 A1 | 1/2019 | Wang et al. |
| 2019/0058113 A1 | 2/2019 | Ramaswamy et al. |
| 2019/0326353 A1 | 10/2019 | O'Brien et al. |
| 2019/0392881 A1 | 12/2019 | Rakshit et al. |
| 2020/0035910 A1 | 1/2020 | Li et al. |
| 2020/0098410 A1 | 3/2020 | Gosavi et al. |
| 2020/0176511 A1 | 6/2020 | Park et al. |
| 2020/0243603 A1 | 7/2020 | Lee et al. |
| 2020/0243752 A1 | 7/2020 | Sasaki |
| 2020/0279992 A1 | 9/2020 | Pham et al. |
| 2021/0056988 A1 | 2/2021 | Chen et al. |
| 2021/0249038 A1 | 8/2021 | Le et al. |
| 2021/0328134 A1 | 10/2021 | Guo et al. |
| 2021/0336127 A1 | 10/2021 | Le et al. |
| 2021/0351342 A1 | 11/2021 | Yui et al. |
| 2021/0367142 A1 | 11/2021 | Lee et al. |
| 2021/0408370 A1 | 12/2021 | York et al. |
| 2022/0005498 A1 | 1/2022 | Le et al. |
| 2022/0013138 A1 | 1/2022 | Hwang et al. |
| 2022/0029090 A1 | 1/2022 | Cho et al. |
| 2022/0044103 A1 | 2/2022 | Nguyen et al. |
| 2022/0068538 A1 | 3/2022 | Apalkov et al. |
| 2022/0069202 A1 | 3/2022 | Nguyen et al. |
| 2022/0310901 A1 | 9/2022 | Oguz et al. |
| 2023/0027086 A1 | 1/2023 | Le et al. |
| 2023/0047223 A1 | 2/2023 | Le et al. |
| 2023/0121375 A1 | 4/2023 | Le et al. |
| 2023/0197132 A1 | 6/2023 | Le et al. |

FOREIGN PATENT DOCUMENTS

| | | |
|---|---|---|
| JP | 2021034480 A | 3/2021 |
| JP | 2021057357 A | 4/2021 |
| JP | 2021128814 A | 9/2021 |
| WO | 2018231292 A1 | 12/2018 |
| WO | 2019054484 A1 | 3/2019 |
| WO | 2019125388 A1 | 6/2019 |
| WO | 2019159885 A1 | 8/2019 |
| WO | 2021221726 A1 | 11/2021 |
| WO | 2023022764 A1 | 2/2023 |

OTHER PUBLICATIONS

Berry et al. "Melting at dislocations and grain boundaries: A phase field crystal study," Physical Review, vol. B 77, No. 224114, 2008, pp. 224114-1-224114-5, DOI: 10.1103/PhysRevB.77.224114.

Buffat et al. "Size effect on the melting temperature of gold particles," Physical Review A, vol. 13, No. 6, Jun. 1976, pp. 2287-2298.

Cantwell et al. "Grain boundary complexions," ScienceDirect, Acta Materialia, vol. 62, No. 152, 2014, pp. 1-48, http://dx.doi.org/10.1016/j.actamat.2013.07.037.

Chi et al. "The Spin Hall Effect of Bi—Sb Alloys Driven by Thermally Excited Dirac-like Electronics," Oct. 28, 2019, ArXiv: 1910, 40 pages, https://arxiv.org/pdf/1910.12433.pdf.

Eustathopoulos "Wetting by Liquid Metals-Application in Materials Processing: The Contribution of the Grenoble Group," Metals, 2015, vol. 5, No. 1, pp. 350-370, doi: 10.3390/met5010350.

Fan et al. "Magnetization switching through giant spin-orbit torque in a magnetically doped topological insulator heterostructure," Nature Materials, vol. 13, Apr. 28, 2014, pp. 669-704, <<https://doi.org/10.1038/nmat3973>>.

(56) References Cited

OTHER PUBLICATIONS

Frolov et al. "Structural phase transformations in metallic grain boundaries," Nature Communications, 2013, vol. 4, No. 1899, pp. 1-7, DOI: 10.1038/ncomms2919.
Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011. 2169946.
International Search Report and the Written Opinion for International Application No. PCT/US2020/065156 mailed Mar. 14, 2021, 13 pages.
International Search Report and the Written Opinion for International Application No. PCT/US2020/066902 mailed Apr. 18, 2021, 12 pages.
International Search Report and the Written Opinion for International Application No. PCT/US2021/033197 mailed Jul. 12, 2021, 9 pages.
International Search Report and the Written Opinion for International Application No. PCT/US2021/033912 mailed Jul. 25, 2021, 9 pages.
Khang et al. "A conductive topological insulator with large spin Hall effect for ultralow power spin-orbit torque switching," Nature Materials, vol. 17, pp. 808-813, Sep. 2018, pp. 808-813, https://doi.org/10.1038/s41563-018-0137-y.
Kogtenkova et al. "Grain Boundary Complexions and Phase Transformations in Al- and Cu-Based Alloys," Metals, 2019, vol. 9, No. 1, doi:10.3390/met9010010, 24 pages.
Kotb et al. "Study of spin transfer torque (STT) and spin orbit torque (SOT) magnetic tunnel junctions (MTJs) at advanced CMOS technology nodes," Electrical and Electronics Engineering: An International Journal, (ELELIJ) vol. 6, No. 1, Feb. 2017, pp. 1-9, 10.14810/elelij.2017.6101.
Lau et al. "Spin-orbit torque switching without an external field using interlayer exchange coupling," Nature Nanotechnology, vol. 11, Sep. 2016, pp. 758-762, <https://doi.org/10.1038/nnano.2016. 84>.
Liu "Spin-orbit Torque Driven Magnetization Switching for Nonvolatile Memory and Beyond," Carnegie Mellon University, May 2020, Thesis, 157 pages, <https://doi.org/10.1184/R1/11933571. v1>, <https://kilthub.cmu.edu/articles/Spinorbit_Torque_Driven_Magnetization_Switching_for_Nonvolatile_Memory_and_Beyond/11933571/files/21908046.pdf>.
Roschewsky et al. "Spin-orbit torque and Nernst effect in Bi—Sb/Co heterostructures," Physical Review, vol. B 99, No. 195103, 2019, pp. 195103-1-195103-5, DOI: 10.1103/PhysRevB.99. 195103.
Roschewsky et al. "Spin-Orbit Torque and Nernst Effect in BiSb/Co Heterostructures," Center for Energy Efficient Electronics Science, University of California—Berkeley, 2018, 12 pages, https://e3s-center.berkeley.edu/wp-content/uploads/2018/11/43Theme-4_Roschewsky_2018E3Sretreat.pdf.
Shao "Spin-Orbit Torques in Topological Insultators," UCLA Electronic Theses and Dissertations; 2015; 76 pages, https://escholarship.org/content/qt3ds9792s/qt3ds9792s.pdf?t=nys 1b5&nosplash=32ac004cc5750a361e60ece735dd2752.
Shirokura et al. "Origin of the Giant Spin Hall Effect in BISb Topological Insulator," ArXiv:1810; 27 pages, https://arxiv.org/ftp/arxiv/papers/1810/1810.10840.pdf.
Tanaka et al. "Thermodynamic Evaluation of Nano-Particle Binary Alloy Phase Diagrams," 2001, Zeitschrift für Metallkunde, vol. 92, No. 11, pp. 1236-1241, http: //hdl.handle.net/11094/26514.
Teague "X-ray and Mossbauer spectroscopy studies of the silicon-antimony and bismuth-antimony alloys," 1971, Scholar's Mine, Doctoral Dissertations, University of Missouri-Rolla, 167 pages.
U.S. Appl. No. 17/401,856, filed Aug. 13, 2021.
U.S. Appl. No. 17/405,954, filed Aug. 18, 2021.
Walker et al. "Composition-dependent structural transition in epitaxial Bi1-xSbx thin films on Si (111)," Physical Review Materials, vol. 3, 064201, Jun. 7, 2019, 8 pages.
Yao et al. "Influence of Crystal Orientation and Surface Termination on the Growth of BiSb thin films on GaAs Substrates," Accepted Manuscript, Journal of Crystal Growth, 2019, 24 pages, doi: https://doi.org/10.1016/j.jcrysgro.2019.01.041.
Yuan et al. "Readback Resolution of Differential Dual CPP Spin Valve Reader," IEEE Transactions on Magnetics, vol. 46, No. 6, Jun. 2010, pp. 1667-1670, 10.1109/TMAG.2010.2045106.
Tuo Fan et al. "Ultrahigh Efficient Spin-Orbit Torque Magnetization Switching in All-Sputtered Topological Insulator—Ferromagnet Multilayer", Jul. 5, 2020, <https://arxiv.org/ftp/arxiv/papers/2007/2007.02264.pdf.
Demasius, Kai-Uwe, et al. "Enhanced spin-orbit torques by oxygen incorporation in tungsten films." Nature communications 7.1 (2016): 1-7.
International Search Report and Written Opinion dated Nov. 16, 2022 for Application No. PCT/US2022/035654.

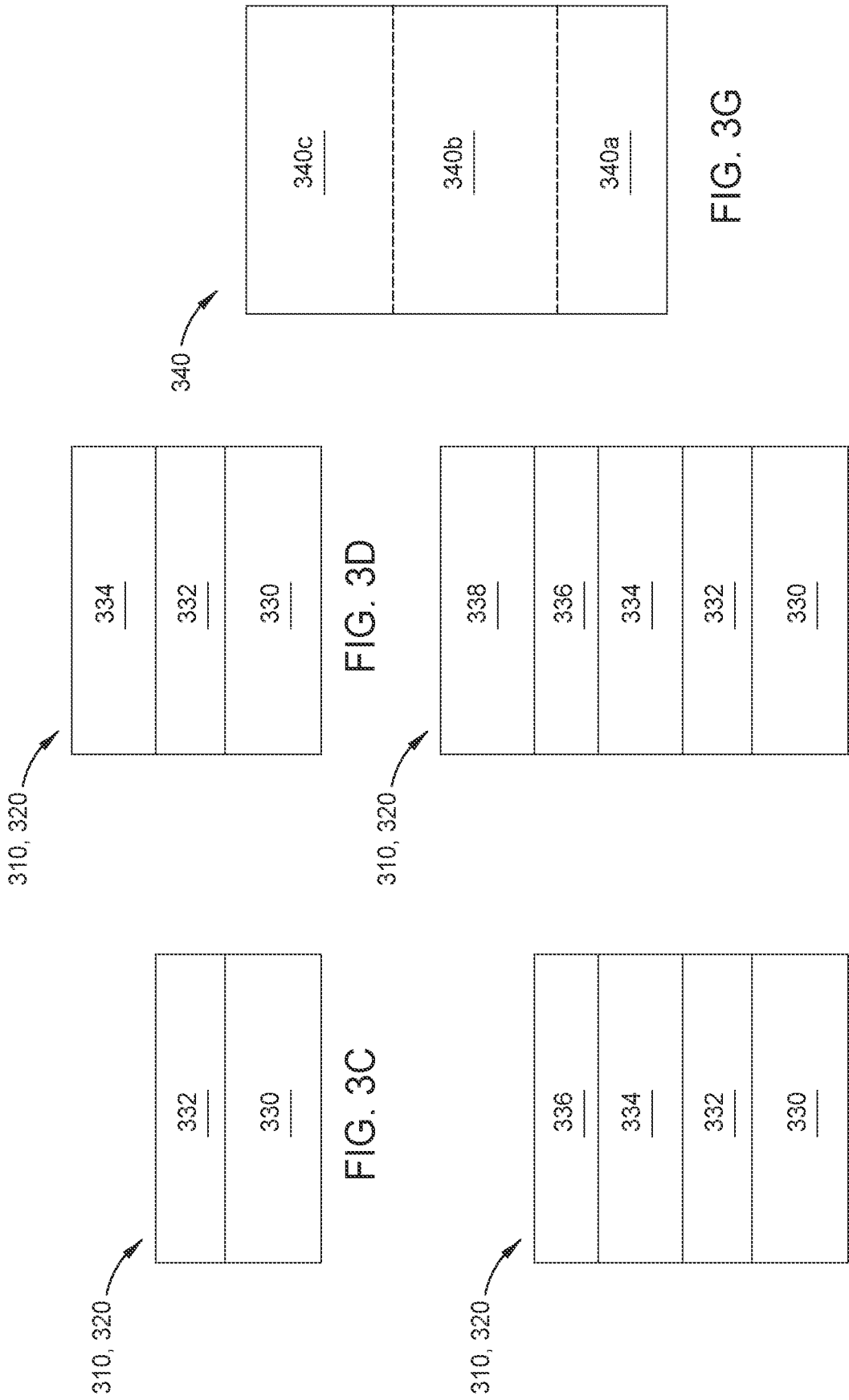

| Coupon | Annealing temp (C) | Kr / N2 | Time (min) | XRD in-plane measurement | | | c-axis | a-axis | c/a ratio |
|---|---|---|---|---|---|---|---|---|---|
| | | | | Size (Å) | mstrain(%) | ΔRs (ohm/sq.) | | | |
| S1-5 | 185 | 5/0 | 60 | 320 | 0.19 | -8 | 12.197 | 4.5127 | 2.703 |
| S2-1 | 185 | 5/10 | 60 | 202 | 0.12 | 148 | 12.010 | 4.5224 | 2.656 |
| S1-6 | 195 | 5/0 | 60 | 312 | 0.17 | 133 | 12.234 | 4.5137 | 2.710 |
| S2-5 | 195 | 5/10 | 60 | 207 | 0.13 | 73 | 12.003 | 4.5255 | 2.652 |
| S1-4 | 225 | 5/0 | 60 | 284 | 0.17 | -256 | 12.229 | 4.5160 | 2.708 |
| S2-2 | 225 | 5/10 | 60 | 200 | 0.10 | 234 | 12.041 | 4.5270 | 2.660 |
| S1-3 | 250 | 5/0 | 75 | 317 | 0.16 | 143 | 12.254 | 4.5214 | 2.710 |
| S2-3 | 250 | 5/10 | 75 | 240 | 0.11 | 18 | 12.126 | 4.5346 | 2.674 |

FIG. 8B

| Type | Sample | As-deposited | | | Annealed | | | Rs Delta (ann - as-dep) | Rs Delta/ Mean |
|---|---|---|---|---|---|---|---|---|---|
| | | Rs Ohm/sq | Sigma | sigma/mean | Rs Ohm/sq | Sigma | sigma/mean | | |
| BiSb_Ar only | S13 | 898.6 | 53.03 | 5.90% | 1041.72 | 133.98 | 12.86% | 143.12 | 3.69% |
| | S14 | 1521.15 | 566.4 | 37.23% | 1265.42 | 163.36 | 12.91% | -255.73 | -4.59% |
| | S15 | 1195.63 | 194.47 | 16.27% | 1188.01 | 141.81 | 11.94% | -7.62 | -0.16% |
| | S16 | 932.39 | 162.54 | 17.43% | 1065.52 | 58.68 | 5.51% | 133.14 | 3.33% |
| BiSb_ 10N2 | S21 | 866.01 | 6.42 | 0.74% | 1013.9 | 92.53 | 9.13% | 147.89 | 3.93% |
| | S22 | 870.93 | 14.57 | 1.67% | 1104.93 | 144.03 | 13.04% | 234 | 5.92% |
| | S23 | 923.23 | 99.35 | 10.76% | 941.64 | 116.41 | 12.36% | 18.41 | 0.49% |
| | S25 | 918.05 | 116.26 | 12.66% | 990.94 | 118.04 | 11.91% | 72.88 | 1.91% |

FIG. 8C

| Wafer ID | Slot | Figure Angle (°) | Deposition Time (s) | Process Condition | Thickness (Å) | Depo Rate (Å/s) | ResMap | | Resistivity (µΩ-cm) | Conductivity 1/resistivity X 1000 | AFM Roughness | |
|---|---|---|---|---|---|---|---|---|---|---|---|---|
| | | | | | | | Rs (Ω/sq) | Rs, Sigma% | | | Ra (nm) | RMS (nm) |
| Slot 2 | 2 | 50 | 300 | 750V/150 mA, Kr5, N10 | 488 | 1.627 | 163.9 | 0.74 | 799.832 | 1.250 | 2.30 | 3.92 |
| Slot 3 | 3 | 50 | 240 | | 404 | 1.683 | 202.3 | 0.84 | 817.292 | 1.224 | 1.87 | 3.03 |
| Slot 4 | 4 | 50 | 180 | | 298 | 1.656 | 263.5 | 0.76 | 785.2 | 1.274 | 1.44 | 2.24 |
| Slot 5 | 5 | 50 | 120 | | 198 | 1.650 | 377.1 | 0.76 | 746.7 | 1.339 | 0.99 | 1.27 |
| Slot 6 | 6 | 50 | 60 | | 102 | 1.700 | 673.3 | 1.05 | 686.8 | 1.456 | 0.62 | 0.78 |
| Slot 7 | 7 | 50 | 300 | 750V/150 mA, Kr5 | 576 | 1.920 | 169.2 | 0.36 | 974.6 | 1.026 | 8.15 | 14.28 |
| Slot 8 | 8 | 50 | 240 | | 481 | 2.004 | 207.4 | 0.40 | 997.6 | 1.002 | 6.88 | 13.33 |
| Slot 9 | 9 | 50 | 180 | | 350 | 1.944 | 259.8 | 0.54 | 909.3 | 1.100 | 4.16 | 8.89 |
| Slot 10 | 10 | 50 | 120 | | 236 | 1.967 | 356.8 | 0.68 | 842.0 | 1.188 | 2.41 | 5.31 |
| Slot 11 | 11 | 50 | 60 | | 125 | 2.083 | 565.9 | 0.76 | 707.4 | 1.414 | 0.95 | 1.21 |

N = 4 all samples

FIG. 9B

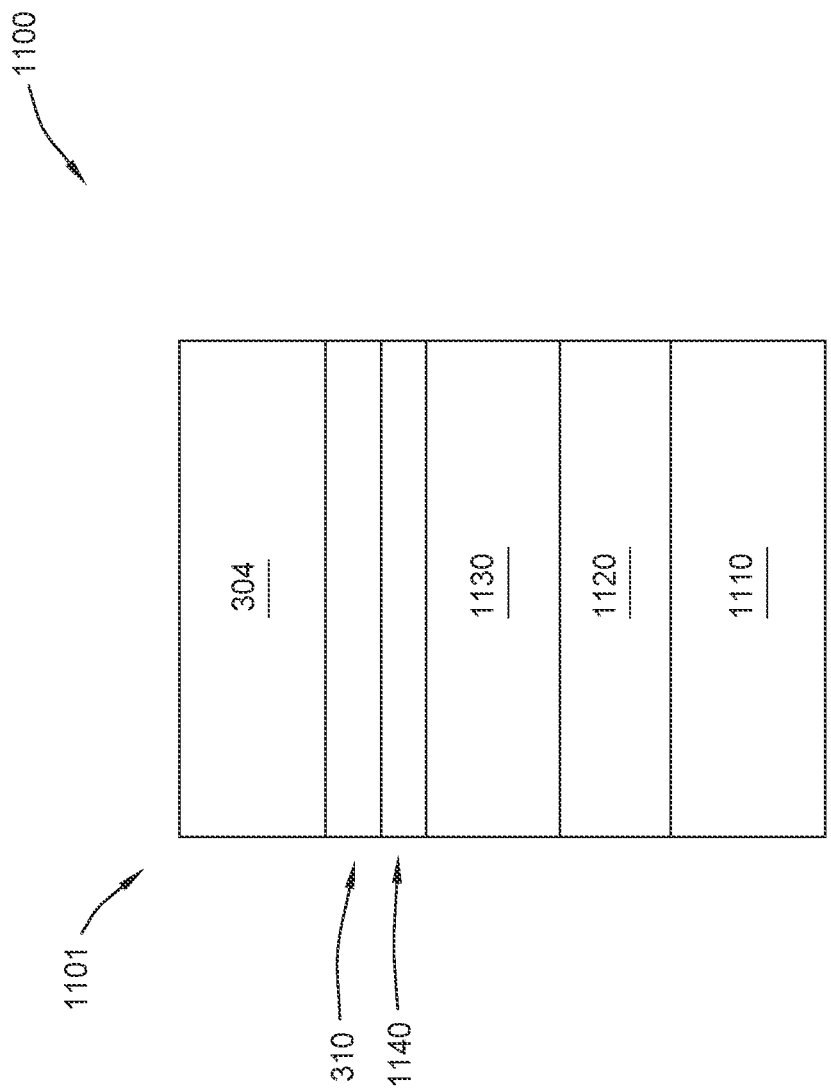

DOPING PROCESS TO REFINE GRAIN SIZE FOR SMOOTHER BiSb FILM SURFACE

CROSS-REFERENCE TO RELATED APPLICATIONS

This application claims benefit of U.S. Provisional Patent Application Ser. No. 63/292,582, filed Dec. 22, 2021.

BACKGROUND OF THE DISCLOSURE

Field of the Disclosure

Embodiments of the present disclosure generally relate to a doped bismuth antimony (BiSbE) layer with (012) orientation for use as a topological insulator where E is the dopant.

Description of the Related Art

BiSb with (012) orientation is a narrow gap topological insulator with both giant spin Hall effect and high electrical conductivity. BiSb is a material that has been proposed in various spin-orbit torque (SOT) applications, such as for a spin Hall layer for magnetoresistive random access memory (MRAM) devices and energy-assisted magnetic recording (EAMR) write heads.

However, BiSb materials have yet to be adopted in commercial SOT applications due to several obstacles. For example, BiSb materials have low melting points, large grain sizes, significant Sb migration issues upon thermal annealing due to film roughness, difficulty maintaining a (012) orientation for maximum spin Hall effect, and are generally soft and easily damaged by ion milling.

Therefore, there is a need for an improved SOT device and process of forming a BiSb layer with (012) orientation with a smaller grain size reducing film roughness and thereby decreasing Sb migration issues.

SUMMARY OF THE DISCLOSURE

The present disclosure generally relates to spin-orbit torque (SOT) magnetic tunnel junction (MTJ) devices comprising a doped bismuth antimony (BiSbE) layer having a (012) orientation. The devices may include magnetic write heads, read heads, or MRAM devices. The dopant in the BiSbE layer enhances the (012) orientation. The BiSbE layer may be formed on a texturing layer to ensure the (012) orientation, and a migration barrier may be formed over the BiSbE layer to ensure the antimony does not migrate through the structure and contaminate other layers. A buffer layer and interlayer may also be present. The buffer layer and the interlayer may each independently be a single layer of material or a multilayer of material. The buffer layer and the interlayer each comprises at least one a tetragonal (001) material, a tetragonal (110) material, a body-centered cubic (bcc) (100) material, a face-centered cubic (fcc) (100) material, a textured bcc (100) material, a textured fcc (100) material, a textured (100) material, or an amorphous metallic material. The buffer layer and the interlayer inhibit antimony (Sb) migration within the doped BiSbE layer and enhance uniformity of the doped BiSbE layer while further promoting the (012) orientation of the doped BiSbE layer.

In another embodiment, a spin-orbit torque (SOT) device comprises: a substrate; and a doped bismuth antimony (BiSbE) layer disposed over the substrate, wherein the doped BiSbE layer has a (012) orientation, wherein E is a dopant, and wherein the dopant is present in an amount of between about 0.5 atomic percent and about 5 atomic percent of the doped BiSbE layer.

In another embodiment, a spin-orbit torque (SOT) device comprises: a substrate; a doped bismuth antimony (BiSbE) layer disposed over the substrate, wherein the doped BiSbE layer has a (012) orientation and wherein E is a dopant; an interlayer disposed over the doped BiSbE layer; and a magnetic tunnel junction (MTJ) stack disposed over the interlayer.

In another embodiment, a method of forming a spin-orbit torque (SOT) device comprises: disposing a substrate in a sputtering chamber, wherein the sputtering chamber comprises a sputtering target; flowing a sputtering gas into the sputtering chamber, wherein the sputtering gas comprises an inert gas and a non-reactive dopant gas; applying a bias to the sputtering target; and depositing a doped bismuth antimony (BiSbE) layer over the substrate, wherein E is a dopant from the dopant gas and wherein the doped BiSbE layer has a (012) orientation.

In one embodiment, a method of forming a spin-orbit torque (SOT) device comprises: disposing a substrate in a sputtering chamber; flowing a sputtering gas into the chamber, the sputtering gas comprising a non-reactive dopant gas; applying a bias to a sputtering target; and depositing a bismuth antimony (BiSb) layer on the substrate, wherein the BiSb layer is doped with the non-reactive dopant gas.

In another embodiment, a spin-orbit torque (SOT) device comprises: a substrate; and a bismuth antimony dopant element (BiSbE) layer over the substrate, the BiSbE layer having a (012) orientation, the BiSbE layer comprising: bismuth; antimony; and a non-reactive element, wherein the non-reactive dopant element comprises about 0.5 atomic % to about 5 atomic % of the BiSbE layer.

In yet another embodiment, a method of forming a spin-orbit torque (SOT) device comprises: disposing a substrate in a sputter chamber; depositing a seed layer over the substrate; depositing a bismuth antimony (BiSb) layer over the seed layer, wherein depositing the BiSb layer comprises providing a sputtering gas that comprises an inert gas such as Ar, Ne, Kr, Xe, or combinations thereof. The sputtering gas will also comprise a non-reactive dopant gas such as $N_2$; $H_2$; $C_xH_y$, where x and y are numerals; and combinations thereof. The method also comprises depositing an interlayer over the doped BiSb layer.

In yet another embodiment, according to the methods described above, a spin-orbit torque (SOT) magnetic tunnel junction (MTJ) MRAM device may be formed, wherein the SOT MTJ device, comprises: a substrate; a buffer layer formed on the substrate, the buffer layer comprising: a first intermediary layer, wherein the first intermediary layer comprises a material selected from the group of a tetragonal textured (001), (110) material, a textured bcc or B2 (100) material, a textured fcc (100) material, a textured (100) material, or an amorphous metallic material, and a bismuth antimony (BiSb) layer having a (012) orientation formed using a method described above over the buffer layer, wherein the BiSb layer comprises: a tri-layer structure including a first Bi layer, wherein the BiSb layer is disposed on the first Bi layer, and a second Bi layer disposed on the BiSb layer, wherein the buffer layer is configured to reduce migration of Sb in the BiSb layer.

In yet another embodiment, according to the methods described above, a spin-orbit torque (SOT) magnetic tunnel junction (MTJ) MRAM device may be formed, wherein the SOT MTJ device, comprises: a substrate; a buffer layer formed over the substrate, the buffer layer comprising: a textured layer with a (100) orientation; and a first intermediary layer disposed over the textured layer, wherein the first intermediary layer is comprised of a material selected from the group consisting of textured layers of tetragonal (001), tetragonal (110), textured bcc or B2 (100), textured fcc (100), and combinations thereof; a bismuth antimony (BiSb) layer formed using a method described above over the buffer layer, wherein the BiSb layer has a (012) orientation, wherein the buffer layer is configured to reduce diffusion of Sb in the BiSb layer; and an interlayer disposed on the BiSb layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3C-3F illustrate exemplary multilayer structures of the buffer layer and/or the interlayer that may be utilized with the SOT MTJ devices of FIGS. 3A and 3B, according to various embodiments.

FIG. 3G is a schematic cross-sectional view of a BiSbE layer comprising sublayers, which may be the BiSbE layer of the SOT MTJ devices of FIGS. 3A and 3B, according to one embodiment.

FIGS. 8B and 8C illustrate tables containing film properties of BiSb and BiSbN coupons at various annealing temperatures.

FIG. 9B illustrates a roughness summary table of the RMS roughness chart of FIG. 9A.

FIG. 11 is a schematic cross-sectional view of a SOT MTJ used as a MRAM device.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
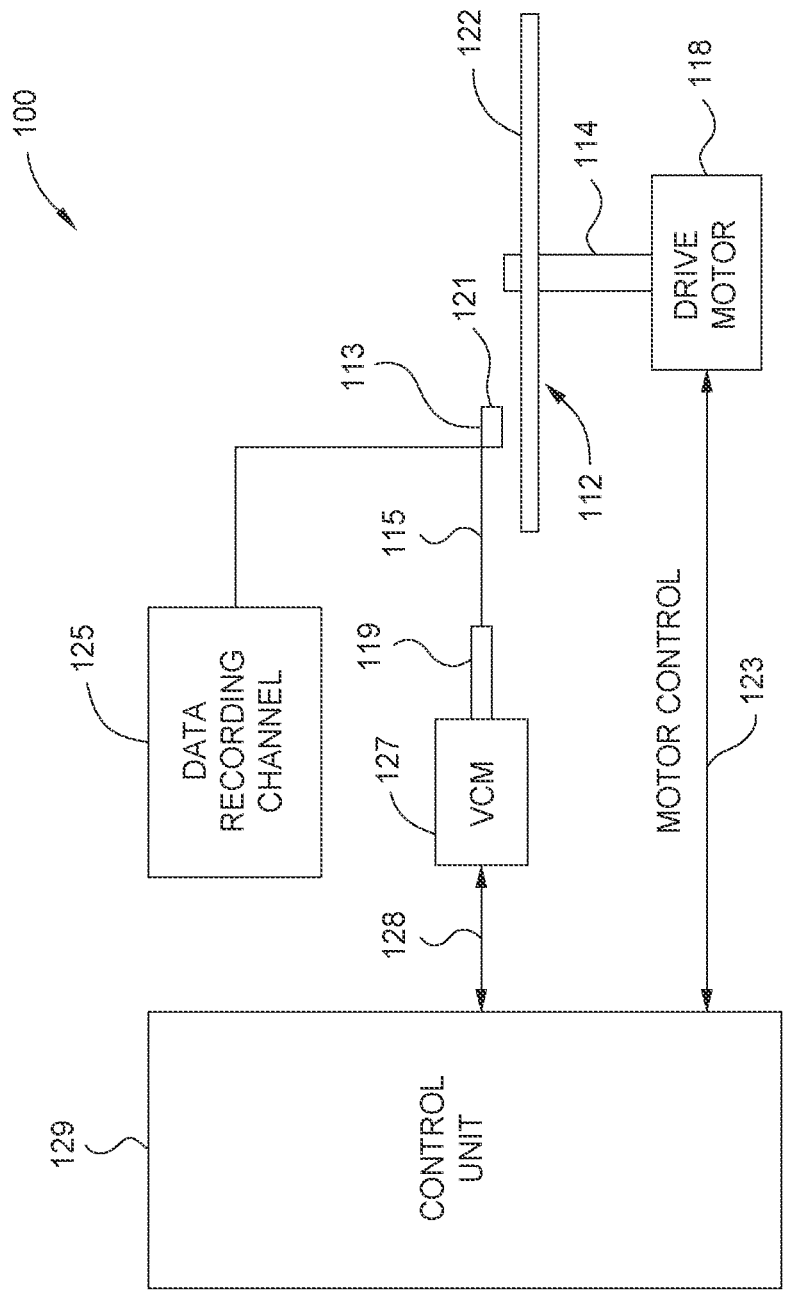
FIG. 1 is a schematic illustration of certain embodiments of a magnetic media drive including a read/write head having a SOT MTJ device.

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present disclosure generally relate to a buffer layer that promotes preservation of a bismuth antimony (BiSb) layer having a (012) orientation. Antimony (Sb) is highly reactive, and the buffer layer provides a low-reactive medium that reduces chemical interaction between the BiSb layer and external materials while promoting the growth of the BiSb in a (012) orientation. The configuration of the buffer layer reduces the migration of Sb in the BiSb layer.

A BiSb layer having a (012) orientation has a large spin Hall angle effect and high electrical conductivity. A BiSb layer having a (012) orientation can be used to form a spin-orbit torque (SOT) magnetic tunnel junction (MTJ) device. For example, a BiSb layer having a (012) orientation can be used as a spin Hall layer in a spin-orbit torque device in a magnetic recording head, e.g., as part of a read head, and/or a microwave assisted magnetic recording (MAMR) write head. In another example, a BiSb layer having a (012) orientation can be used as a spin Hall electrode layer in a magnetoresistive random access memory (MRAM) device. The SOT MTJ device can be in a perpendicular stack configuration or an in-plane stack configuration. The SOT MTJ device can be utilized in, for example, read and/or write heads, in MRAM, in artificial intelligence chips, and in other applications. A BiSb layer stack with a (012) orientation has a higher spin Hall angle and higher performance in a SOT MTJ device than a BiSb layer with a (001) orientation.

Embodiments of the present disclosure generally relate to a bismuth antimony (BiSb) layer with (012) orientation doped with a non-reactive gas for use as topological insulators. In one embodiment, a spin-orbit torque device comprising: a substrate; a doped BiSbE layer over the substrate, the BiSbE layer having a (012) orientation, the BiSbE layer comprising: bismuth; antimony; and a dopant. The dopant is selected from a group consisting of $N_2$, $H_2$, $C_xH_y$, where x and y are numerals, and combinations thereof. In another embodiment, a method of forming a SOT device comprises: depositing a substrate in a sputtering chamber; flowing a sputtering gas into the chamber, the sputtering gas comprising a non-reactive gas; applying a bias to a sputtering target; and depositing a bismuth antimony (BiSb) layer on the substrate.

FIG. 1 is a schematic illustration of certain embodiments of a disk drive 100 including a read/write head having a SOT MTJ device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on the magnetic disk 112. Write and read signals are communicated to and from write and read heads on the magnetic head assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders.

It is to be understood that the embodiments discussed herein are applicable to a data storage device such as a hard disk drive (HDD) as well as a tape drive such as a tape embedded drive (TED) or an insertable tape media drive, such as those conforming to the LTO (Linear Tape Open) standards. An example TED is described in U.S. Pat. No. 10,991,390, issued Apr. 27, 2021, titled "Tape Embedded Drive," and assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figure 2:
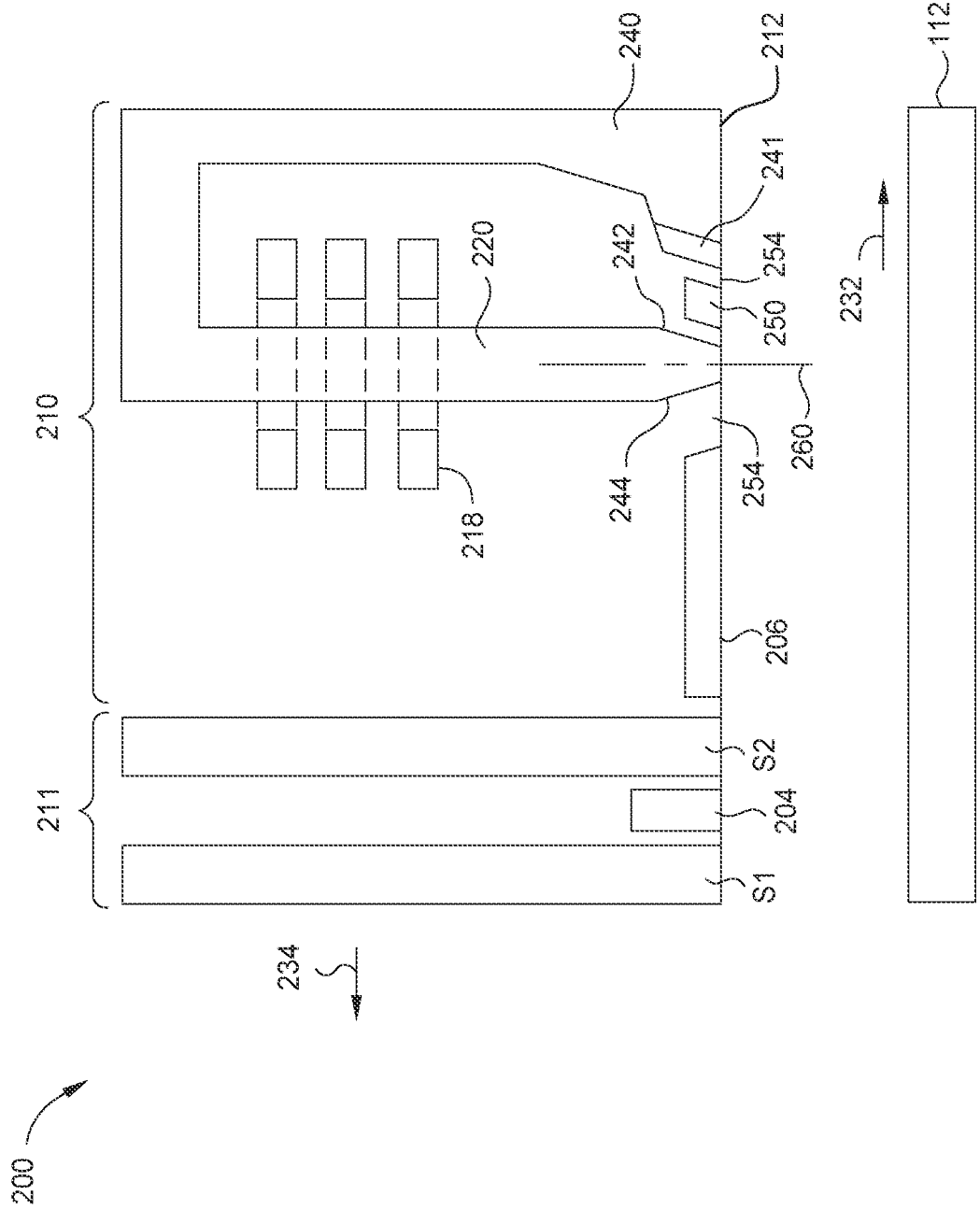
FIG. 2 is a fragmented, cross-sectional side view of certain embodiments of a read/write head having a SOT MTJ device.

FIG. 2 is a fragmented, cross-sectional side view of certain embodiments of a read/write head 200 having a SOT MTJ device. The read/write head 200 faces a magnetic disk 112. The read/write head 200 may correspond to the magnetic head assembly 121 described in FIG. 1. The read/write head 200 includes a media facing surface (MFS) 212, such as a gas bearing surface, facing the magnetic disk 112, a write head 210, and a magnetic read head 211. As shown in FIG. 2, the magnetic disk 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MTJ sensing element 204 located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic disk 112 are detectable by the MR (or MTJ) sensing element 204 as the recorded bits. The SOT MTJ device of various embodiments can be incorporated into the read head 211.

Examples of differential SOT readers are described in United States patent titled "SOT Differential Reader and Method of Making Same," U.S. Pat. No. 11,100,946, filed Jul. 1, 2020, and United States patent titled "SOT Film Stack for differential Reader," U.S. Pat. No. 11,094,338, filed Sep. 23, 2020, each of which is assigned to the same assignee of this application, and which are herein incorporated by reference.

Examples of single SOT readers are described in United States patent titled "Magnetic Sensor Using Spin Hall Effect," U.S. Pat. No. 10,720,570, filed Nov. 29, 2017, and United States patent titled "Magnetic Sensor Using Inverse Spin Hall Effect," U.S. Pat. No. 9,947,347, filed Dec. 20, 2016, each of which is assigned to the same assignee of this application, and which are herein incorporated by reference.

In embodiments where the write head is a MAMR based write head, the MAMR write head 210 includes a main pole 220, a leading shield 206, a trailing shield 240, a spin orbital torque (SOT) device 250, and a coil 218 that excites the main pole 220. The coil 218 may have a "pancake" structure which winds around a back-contact between the main pole 220 and the trailing shield 240, instead of a "helical" structure shown in FIG. 2. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X is selected from a group consisting of Rh, Al, Ta, Zr, Ni, Co, W, Hf, Re, and Ti, and combinations thereof. In certain embodiments, the trailing shield 240 does not include a trailing shield hot seed layer.

Figure 3A:
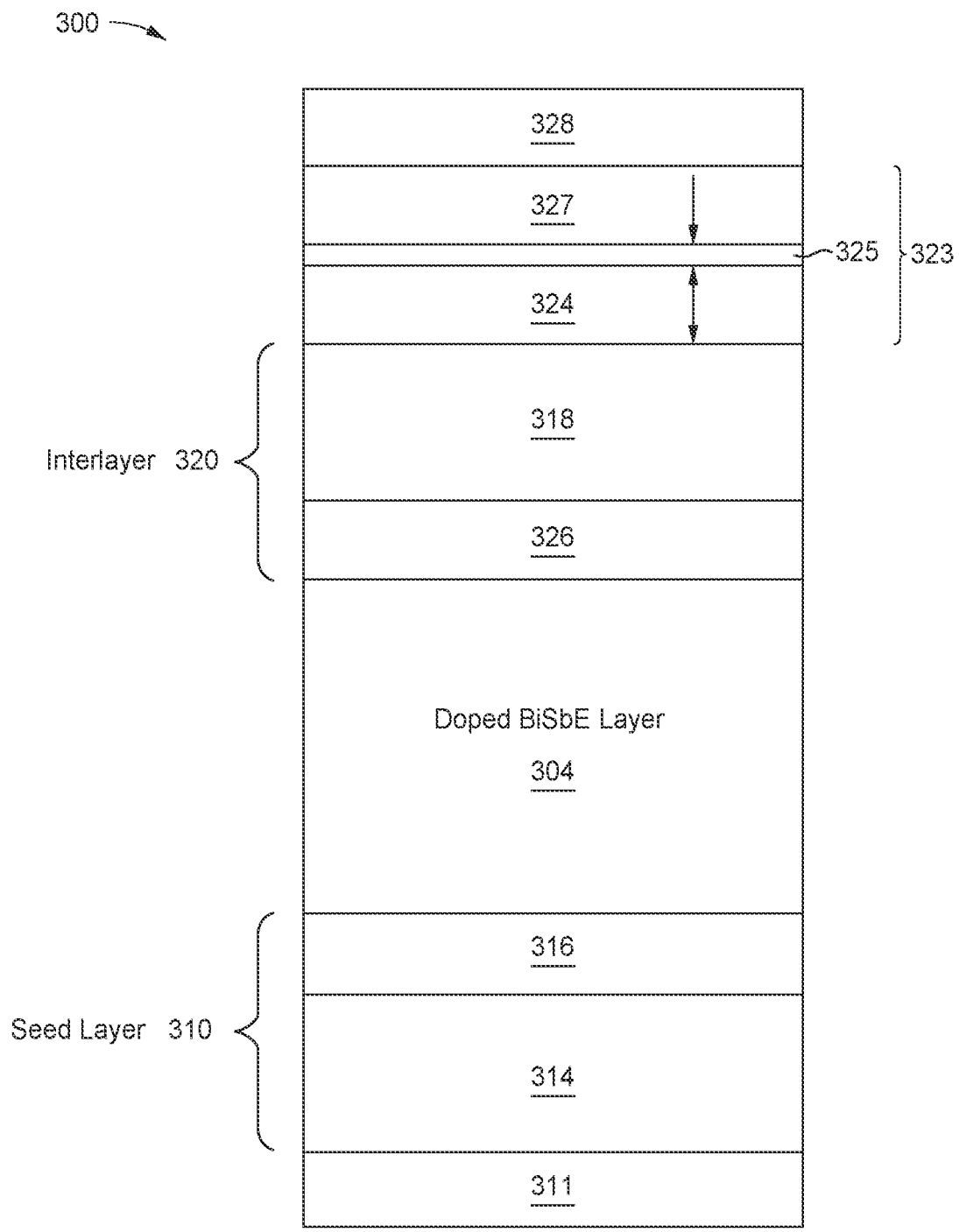
FIG. 3A is a schematic cross-sectional view of certain embodiments of a SOT device having a BiSbE layer with (012) orientation forming a SOT-based MRAM device.

FIG. 3A is a schematic cross-sectional view of certain embodiments of a SOT MTJ device 300 having a doped bismuth antimony (BiSbE) layer 304 with a crystal orientation of (012) forming a SOT-based device.

The SOT MTJ device 300 comprises a substrate 311; a seed layer or buffer layer 310 over the substrate 311; the doped BiSbE layer 304 over the substrate; an interlayer 320 over the doped BiSbE layer 304; a MTJ structure 323 that comprises a free perpendicular magnetic anisotropy (PMA) layer 324 over the interlayer 320, an insulating layer 325 over the free PMA layer 324, and a reference PMA layer 327 over the insulating layer 325; and a cap layer 328 over the reference PMA layer 327.

In one embodiment, the seed layer or buffer layer 310 of SOT MTJ device 300 comprises an amorphous conditioning layer 314 over the substrate layer 311, and a growth B2 or bcc (100) texturing layer 316 over the amorphous conditioning layer 314. The amorphous conditioning layer 314 is comprised of one or more alloys of elements selected from the group consisting of Ni, Fe, Co, Zr, W, Ta, Hf, Ag, Pt, Pd, Si, Ge, Mn, Al, Ti, and combinations thereof. Example alloys include alloys selected from the group consisting of NiTa, NiFeTa, CoHf, CoFeHf, NiW, NiFeW, CoHfB, CoFeB, CoZrTa, NiFeB, CoB, FeB, and alloy combinations thereof. The bcc texturing (100) layer 316 may be a material selected from the group consisting of B2 RuAl phase; heated (temperature 100C-300C) CrX alloys, wherein X=Ru, Mo, W, and Ti<=10 at %; other B2 phase materials like NiAl, or RhAl; and combinations thereof.

The BiSbE layer 304 of SOT MTJ device 300 includes bismuth (Bi), antimony (Sb), and a dopant element (E). Top form the BiSbE layer 304, a sputtering gas that comprises an inert gas such as Ar, Ne, Kr, Xe, or combinations thereof is provided, as is a non-reactive dopant gas such as $N_2$; $H_2$; $C_xH_y$, where x and y are numerals; and combinations thereof. The SOT MTJ device 300 may be used in the MAMR write head of the disk drive 100 of FIG. 1, the read and/or write head 200 of FIG. 2, or other suitable magnetic media drives. The doped BiSbE layer is used as a topological insulator, such as for SOT-based MRAM device or for SOT-based EAMR read head or write head. The doped BiSbE layer can include a plurality of BiSb lamellae layers and one or more doped lamellae layers. The doped BiSbE layer has a (012) orientation. In certain embodiments, the doped BiSbE layer has a higher annealing temperature, stronger (012) texture, smaller grain size, and/or lower surface roughness in comparison to a BiSb material that has not been doped.

The interlayer 320 of SOT MTJ device 300 can have a similar construction as the seed layer or buffer layer 310 mentioned above. Additionally, the interlayer 320 can comprise materials similar to those utilized for the seed layer or buffer layer 310. The interlayer 320 comprises a fcc (100) texturing layer 326 and a texturing layer 318 disposed on the fcc (100) texturing layer 326. In one embodiment, the fcc (100) texturing layer 326 may function as a migration barrier to prevent migration of Sb from the doped BiSbE layer 304. The above mentioned (100) texturing layer 316, the amorphous conditioning layer 314, the texturing layer 318, and the fcc (100) texturing layer 326 each has a lattice parameter in the range of about 4.10 Å to about 4.70 Å. (shown in FIG. 3F). As will be discussed below, the interlayer 320 may alternatively comprise a (001) tetragonal layer 318 (shown in FIGS. 3E and 3F).

The free PMA layer 324 of SOT MTJ device 300 comprises one or more stacks selected from a group consisting of a Co/Pt (i.e., a bilayer of cobalt and platinum where "/" will be used herein to designate a bilayer), Co/Pd, Co/Ni, and combinations thereof. Alternatively, the free PMA layer 324 may comprise one or more layers selected from the group consisting of: CoFeB, FePt, other PMA inducing layers, and combinations thereof. An insulating layer 325, such as a MgO layer, is formed over the free PMA layer 324.

The reference PMA layer 327 of SOT MTJ device 300 comprises one or more stacks selected from the group consisting of a Co/Pt, Co/Pd, Co/Ni, and combinations thereof. Alternatively, the reference PMA layer 327 may comprise one or more layers selected from the group consisting of CoFeB, FePt, other PMA inducing layers, and combinations thereof. The reference PMA layer 327 can include one or more synthetic antiferromagnetic (SAF) pinned structures. The magnetic direction of the reference PMA layer 327 can be set with an anneal temperature of about 260° C. or above for two hours or more.

The cap layer 328 of the SOT MTJ device 300 comprises a material selected from the group consisting of NiFe, SiN, TiN, $Al_2O_3$, $SiO_2$, NiFeTa, NiTa, NiW, NiFeW, CoHf, CoFeHf, Pt, Co, Cu, Ni, NiCu, CoCu, Ru, Ta, Cr, Au, Rh, CoFe CoFeB, other non-magnetic materials, other magnetic materials, and combinations thereof.

It is to be understood that an SOT device that has not been doped may be formed in the same manner as above (i.e. layer 304 comprises BiSb without a dopant).

It is to be further understood that a plurality of the SOT MTJ devices 300 can be configured together as part of a memory cell array in which the doped BiSbE layer 304 is a spin orbit material electrode. A top electrode (not shown) can be disposed over the reference PMA layer 327. Each of the memory cells may be part of a two-terminal device or a three terminal device. The spin orbit material electrode and the top electrode may serve as bit lines, word lines, read word lines, write word lines, and combinations thereof. The memory cell array may be implemented as a cross-point array or other architectures.

Figure 3B:
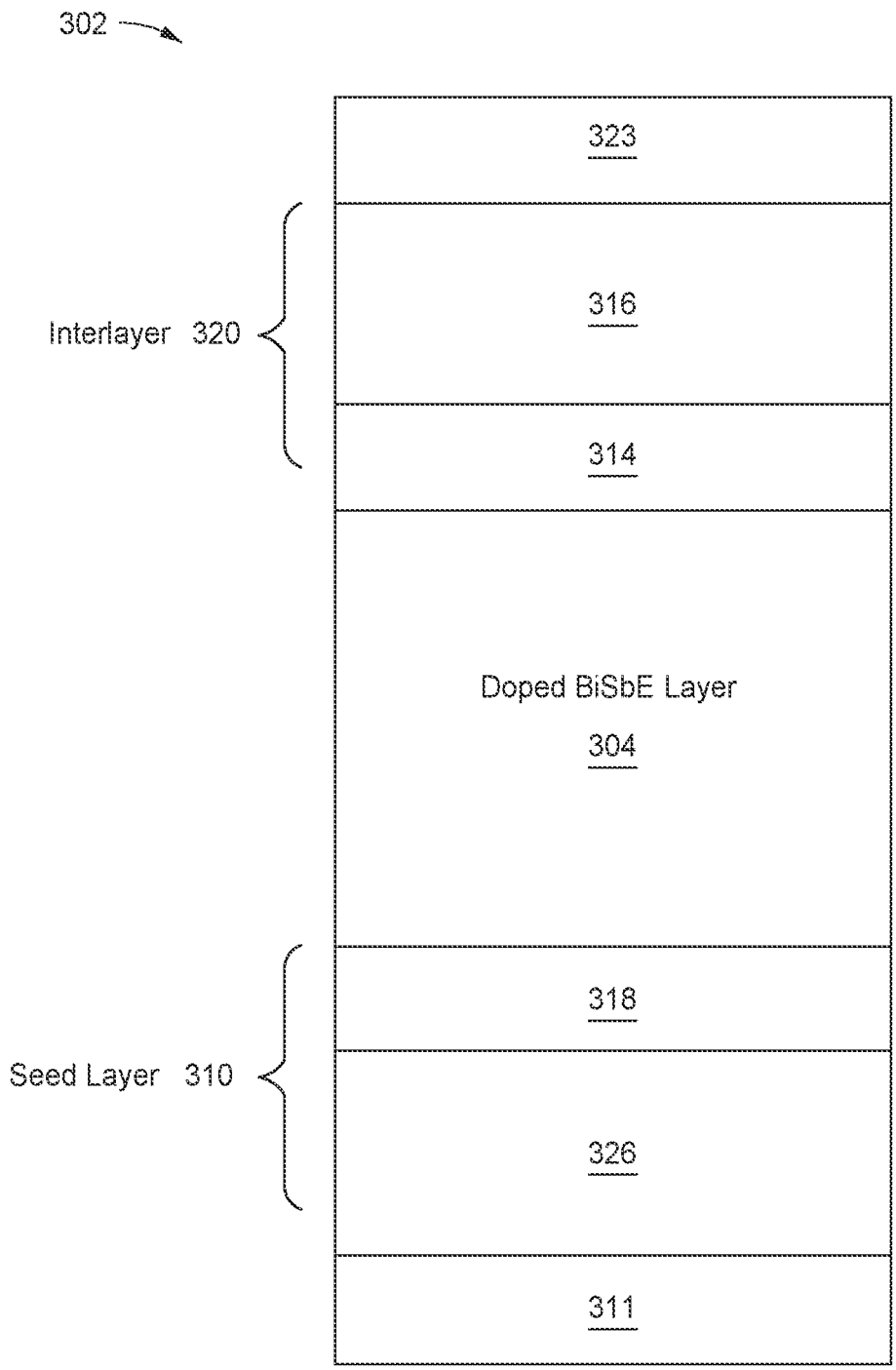
FIG. 3B is a schematic cross-sectional view of certain embodiments of a SOT device having a BiSbE layer with (012) orientation forming a portion or component of a SOT-based energy-assisted magnetic recording (EAMR) write head used in magnetic recording.

FIG. 3B is a schematic cross-sectional view of certain embodiments of a SOT MTJ device 302 having a doped BiSbE layer 304 with a (012) crystal orientation forming a portion or component of a SOT-based EAMR (e.g., MAMR) write head used in magnetic recording. The doped BiSbE layer 304 of SOT MTJ device 302 is the same as the doped BiSbE layer 304 of SOT MTJ device 300. The SOT MTJ device 302 may be used in the read/write head of the disk drive 100 of FIG. 1 or other suitable magnetic media drives, or the read/write head 200 of FIG. 2.

The SOT MTJ device 302 is the same as the SOT MTJ device 300 of FIG. 3A; however, here, a STL (spin torque layer) 323 is formed over the interlayer 320. The STL 323 comprises a ferromagnetic material selected from the group consisting of CoFe; CoIr; NiFe; CoFeM, wherein M is a material selected from the group consisting of B, Ta, Re, Ir; and combinations thereof.

A charge current through the doped BiSbE layer 304 acting as a spin Hall layer generates a spin current in the doped BiSbE layer 304. The spin-orbital coupling of the doped BiSbE layer 304 and the STL 323 causes switching or precession of magnetization of the STL 323 by the spin current from the doped BiSbE layer 304. Switching or precession of the magnetization of the STL 323 can generate an assisting AC and/or DC field to the write field from a main pole of a write head used in magnetic recording. SOT based EAMR elements have multiple times greater power efficiency in comparison to spin-transfer torque (STT) based MAMR elements.

FIGS. 3C-3G illustrate exemplary multilayer structures of the buffer layer 310 and/or the interlayer 320 that may be utilized with the SOT MTJ devices 300 of FIG. 3A and the SOT MTJ device 302 of FIG. 3B, according to various embodiments.

The embodiments of FIGS. 3C-3G can be used in combination with each other and are not an exclusive list of possible buffer layers 310 and/or interlayers 320. Moreover, while each of FIGS. 3C-3G describes both the buffer layer 310 and the interlayer 320, the buffer layer 310 and the interlayer 320 may have different configurations or a different amount of sublayers or intermediate layers such as amorphous conditioning layer 314, texturing layer 316, texturing layer 318, and fcc (100) texturing layer 326 (See FIGS. 3C-3F), allowing better strain relaxation and to enhance or promote (012) growth in the doped BiSbE layer 304. In certain embodiments, the buffer layer 310 and/or the interlayer 320 are deposited by physical vapor deposition (PVD), such as sputtering, molecular beam epitaxy, ion beam deposition, other suitable PVD processes, or combinations thereof. Furthermore, the buffer layer 310 may be the single layer of a crystalline or amorphous material, and the interlayer 320 may be a multilayer structure. As discussed below in more detail, the seed layer or buffer layer 310 or the interlayer 320 can also be a textured fcc (111) single layer or multilayer fcc (111) stack material with lattice parameter between about 3.48 angstrom (Å) to 3.71 Å.

With respect to FIG. 3C, in one embodiment, the seed layer or buffer layer 310 and/or the interlayer 320 comprises a first intermediate layer 330 and a second intermediate layer 332 disposed on the first intermediate layer 330. In one embodiment, the first intermediate layer 330 comprises a metallic amorphous material and the second intermediate layer 332 comprises a tetragonal (001) or (110) material. In another embodiment, the first intermediate layer 330 comprises a metallic amorphous material and the second intermediate layer 332 comprises a textured bcc (100) or B2 material.

With respect to FIG. 3D, in one embodiment, the buffer layer 310 and/or the interlayer 320 comprises the first intermediate layer 330, the second intermediate layer 332 disposed on the first intermediate layer 330, and a third intermediate layer 334 disposed on the second intermediate layer 332. The first intermediate layer 330 comprises a metallic amorphous material and the second intermediate layer 332 comprises a textured bcc (100) or B2 material. In one embodiment, the third intermediate layer 334 comprises a textured bcc (100) or B2 material. In another embodiment, the third intermediate layer 334 comprises an fcc (100) material. In yet another embodiment, the third intermediate layer 334 comprises a tetragonal (001) material.

With respect to FIG. 3E, in one embodiment, the buffer layer 310 and/or the interlayer 320 comprises the first intermediate layer 330, the second intermediate layer 332 disposed on the first intermediate layer 330, the third intermediate layer 334 disposed on the second intermediate layer 332, and a fourth intermediate layer 336 disposed on the third intermediate layer 334. The first intermediate layer 330 comprises a metallic amorphous material and the second intermediate layer 332 comprises a textured bcc (100) or B2 material. In one embodiment, the third intermediate layer 334 comprises a textured bcc (100) or B2 material and the fourth intermediate layer 336 comprises an fcc (100) material. In another embodiment, the third intermediate layer 334 comprises a textured bcc (100) or B2 material and the fourth intermediate layer 336 comprises a tetragonal (110) material. In yet another embodiment, the third intermediate layer 334 comprises a textured bcc (100) or B2 material and the fourth intermediate layer 336 comprises a tetragonal (001) material.

With respect to FIG. 3F, in one embodiment, the buffer layer 310 and/or the interlayer 320 comprises the first intermediate layer 330, wherein the first intermediate layer 330 comprises a metallic amorphous material, the second intermediate layer 332 comprising a textured bcc (100) or B2 material, the third intermediate layer 334 comprising a textured bcc (100) or B2 material, the fourth intermediate layer 336 comprising a tetragonal (001) material, and a fifth intermediate layer 338 comprising an fcc (100) material.

The amorphous metallic material of the first intermediate layer 330 of FIG. 3F may comprise one or more elements selected from the group consisting of Ni, Fe, Co, Zr, W, Ta, Hf, Ag, Pt, Pd, Si, Ge, Mn, Al, Ti, and combinations thereof. Additionally or alternatively, the first intermediate layer 330 may comprise one or more compounds selected from the group consisting of NiTa, NiFeTa, NiNb, NiW, NiFeW, NiFeHf, CoHfB, CoZrTa, CoFeB, NiFeB, CoB, FeB, and alloy combinations thereof. Further, the amorphous metallic material may have a nearest neighbor (XRD) diffraction peak with a d-spacing for that peak, between about 2.0 Å to about 2.2 Å.

The textured bcc (100) or B2 material of the second intermediate layer 332 and the third intermediate layer 334 may be similar or different. In the situation of a B2 material, the material may be selected from the group consisting of B2 phase RuAl alone or in combination with other B2 phases like NiAl and RhAl; Cr at a temperature greater than or equal to 150° C.; or heated CrX alloys wherein X=Ru, Mo, W, or Ti<=10 at. %, and heated to 100-300° C.). In the situation of the textured bcc (100) material, the material may be selected from the group consisting of V, Nb, Mo, W, Ta, WTi$_{50}$, Cr, alloy combinations thereof, and alloy combinations thereof with one or more additional elements selected from the group consisting of: Ti, Al, Ge, Si, Ag, Cu, Mn, Pd, Pt, Ni, Co, Fe, and combinations thereof. Further, the textured bcc (100) or B2 material may have an a-axis lattice parameter between about 2.88 Å and 3.31 Å.

The tetragonal (001) or (110) material of the fourth intermediate layer 336 of FIG. 3F may have an a-axis in the range of about 4.2 Å to about 4.7 Å and a c-axis in the range of about 2.88 Å to about 3.15 Å. The tetragonal (001) or (110) material may be selected from the group consisting of:

$SbO_2$, $TiO_2$, $IrO_2$, $RuO_2$, $CrO_2$, $VO_2$, $OsO_2$, $RhO_2$, $PdO_2$, $WVO_4$, $CrNbO_4$, $SnO_2$, $GeO_2$, composites thereof, alloys thereof, and alloys thereof with one or more additional elements selected from the group consisting of W, Nb, and combinations thereof.

The fcc (100) material of the fifth intermediate layer 338 of FIG. 3F may have a lattice parameter in the range of about 4.10 Å to about 4.70 Å. The fcc (100) material may selected from the group consisting of Ag, Al, Au, FeO, CoO, ZrO, MgO, TiO, ScN, TiN, NbN, ZrN, HfN, TaN, ScC, TiC, NbC, ZrC, HfC, TaC, WC, and combinations thereof, alloys thereof, and in alloy combinations thereof with one or more additional elements selected from the group consisting of: W, Al, Ag, W, Mo, Zr, Ti, Ge Si, and combinations thereof.

In certain embodiments described above, the buffer layer 310 and/or the interlayer 320 are deposited by physical vapor deposition (PVD), such as sputtering, molecular beam epitaxy, ion beam deposition, other suitable PVD processes, or combinations thereof.

FIG. 3G is a schematic cross-sectional view of an undoped BiSb layer 340 comprising sublayers, which may replace the doped BiSbE layer 304 of the SOT MTJ devices 300, 302 of FIGS. 3A-3B, according to one embodiment. FIG. 3G is to illustrate the benefits of the sandwiching a BiSb (or doped BiSbE) layer between Bi layers. The Bi layers act as composition modulation layers to ultimately make the composition depth more uniform for either BiSb in either undoped or doped form. After deposition and/or annealing, Sb has a tendency to move out to the interfaces of the undoped BiSb or doped BiSbE layers. A thin Bi layer on either side of the undoped BiSb or doped BiSbE layer can take in any Sb that may migrate from the undoped BiSb or doped BiSbE layer and hence reduce a huge composition gradient that may occur during deposition and/or after annealing. The thin Bi layers can be grown on undoped BiSb or doped BiSbE or used as a seed layer for undoped BiSb or doped BiSbE layers and still promote (012) growth while improving composition modulation within the SOT MTJ device.

The undoped BiSb layer 340 of FIG. 3G comprises Bi laminates 304a, 304c. A first Bi sublayer 304a is disposed on the buffer layer 310. A BiSb sublayer 304b is disposed on the first Bi sublayer 304a. The BiSb sublayer 304b may comprise Sb in an atomic percentage of about 10% to about 20%. A second Bi sublayer 304c is disposed on the BiSb sublayer 304b. In some embodiments, the first and second Bi sublayers 304a, 304c each has a thickness less than or equal to about 10 Å and serve as composition modulation sublayers to enhance thickness composition uniformity.

The undoped BiSb layer 340 of FIG. 3G has a (012) orientation. In some embodiments, the undoped BiSb layer 340 comprises $Bi_{1-x}Sb_x$ wherein x is 0<x<1. In certain embodiments, the undoped BiSb layer 340 comprises $Bi_{1-x}Sb_x$ wherein x is 0.05<x<0.2, or comprises antimony in an atomic percent content from about 7% to about 22%.

Figure 4:
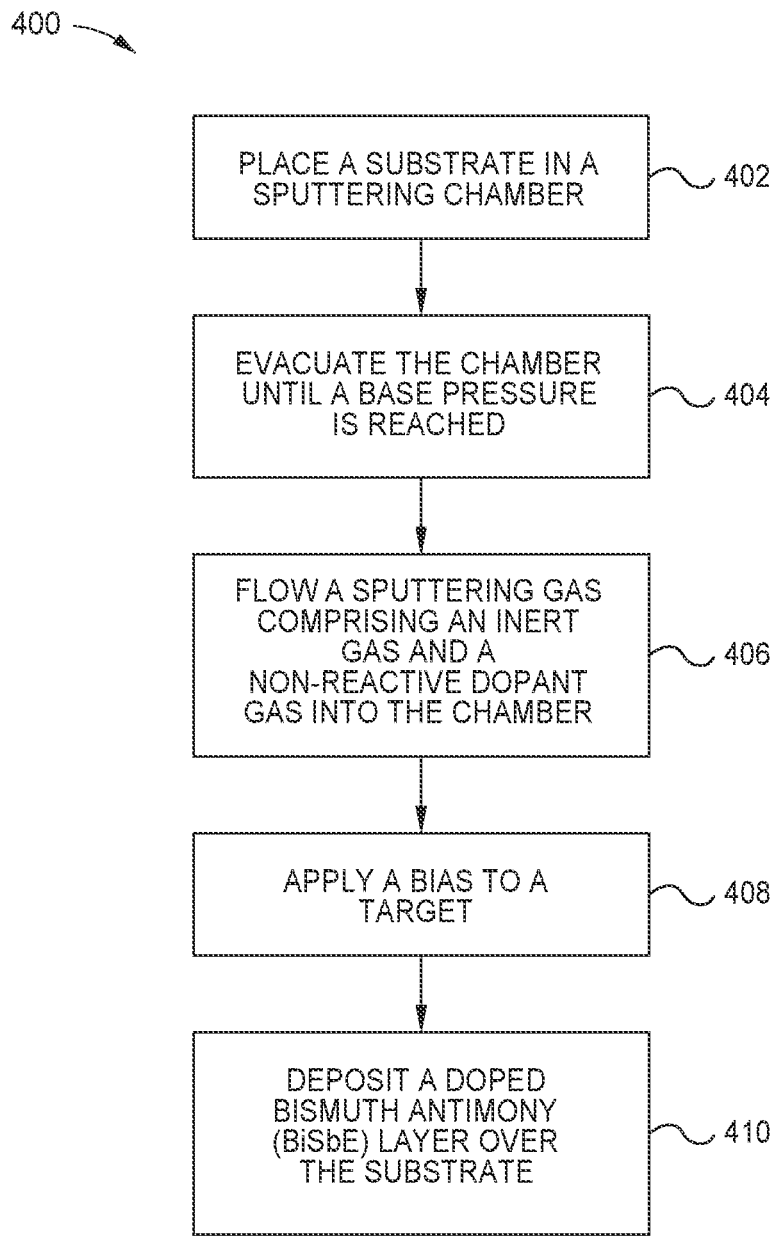
FIG. 4 is a flowchart illustrating a method of forming a doped BiSbE layer.

FIG. 4 is a flowchart illustrating a method 400 of forming a doped BiSbE layer. The doped BiSbE layer may be the doped BiSbE layer 304 in the SOT MTJ device 300 of FIG. 3A, or the doped BiSbE layer 304 of the SOT MTJ device 302 of FIG. 3B. The SOT MTJ devices 300 and 302 may be used as part of an MRAM cell, in the read/write head of the disk of FIG. 1 or other suitable magnetic media drives, or the read and/or write head of FIG. 2.

At 402 of method 400, a substrate is disposed into a sputtering chamber. The substrate may be the substrate 311 of FIG. 3A or 3B. At 404 of method 400, the sputtering chamber is evacuated until a base pressure is reached. At 406 of method 400, a sputtering gas is delivered into the sputtering chamber. To form a doped BiSbE layer, the sputtering gas comprises an inert gas such as Ar, Ne, Kr, Xe, or combinations thereof. The sputtering gas will also comprise a non-reactive dopant gas such as $N_2$; $H_2$; $C_xH_y$, where x and y are numerals; and combinations thereof. In some embodiments, the sputtering gas comprises a mixture ratio of 1:1 of inert gas to the non-reactive dopant gas. In other embodiments, the sputtering gas comprises a mixture ratio of 1:2 of inert gas to non-reactive dopant gas.

At 408 of method 400, a bias is applied to a sputtering target disposed in the sputter chamber, wherein the sputter target is the material to be deposited on the substrate (e.g., BiSb). At 410 of method 400, the doped BiSbE layer is deposited over the substrate. The doped BiSbE layer contains the element(s) of the non-reactive dopant gas.

Figure 5:
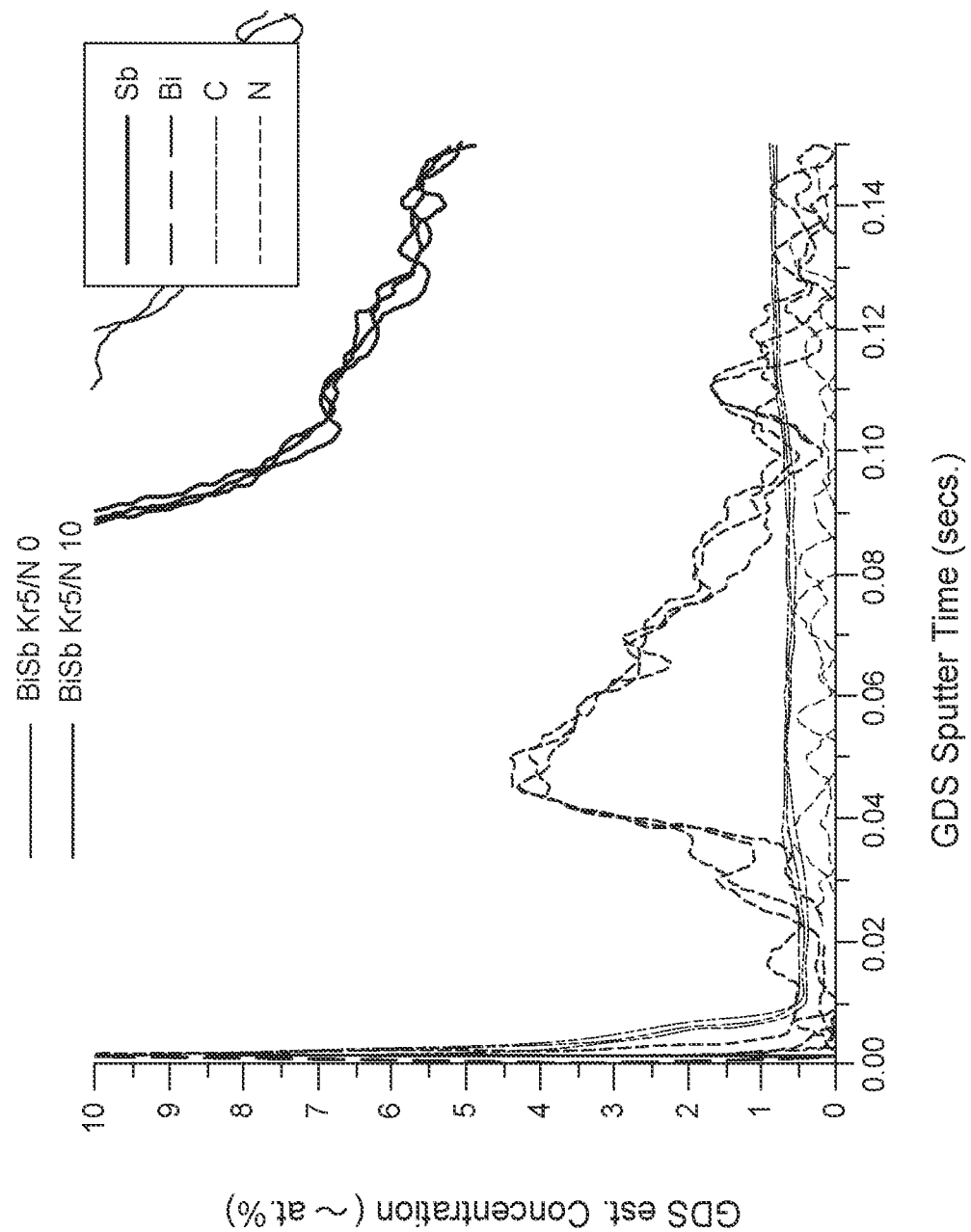
FIG. 5 illustrates Glow Discharge Spectrometry (GDS) Sputter Time in seconds vs. GDS estimated concentration of an elements in a BiSb and BiSbE film.

FIG. 5 illustrates Glow Discharge Spectrometry (GDS) Sputter Time in seconds vs. GDS estimated concentration, where the GDS estimated concentration is the approximate atomic % (at. %) of various elements in a non-doped BiSb film and a doped BiSbE film. A non-doped BiSb film and a doped BiSbE film doped with $N_2$ were measured for the presence of Sb, Bi, carbon (C), and $N_2$. The doped BiSbE film doped with $N_2$ had detectable levels of $N_2$ of up to about 4-5 atomic %. However, the non-doped BiSb film shows no detectable $N_2$ in the film. The $N_2$ present in the doped BiSbE film is desirable because the $N_2$ reduces the grain size of the film during formation of the film and hence promote (012) growth.

Figure 6:
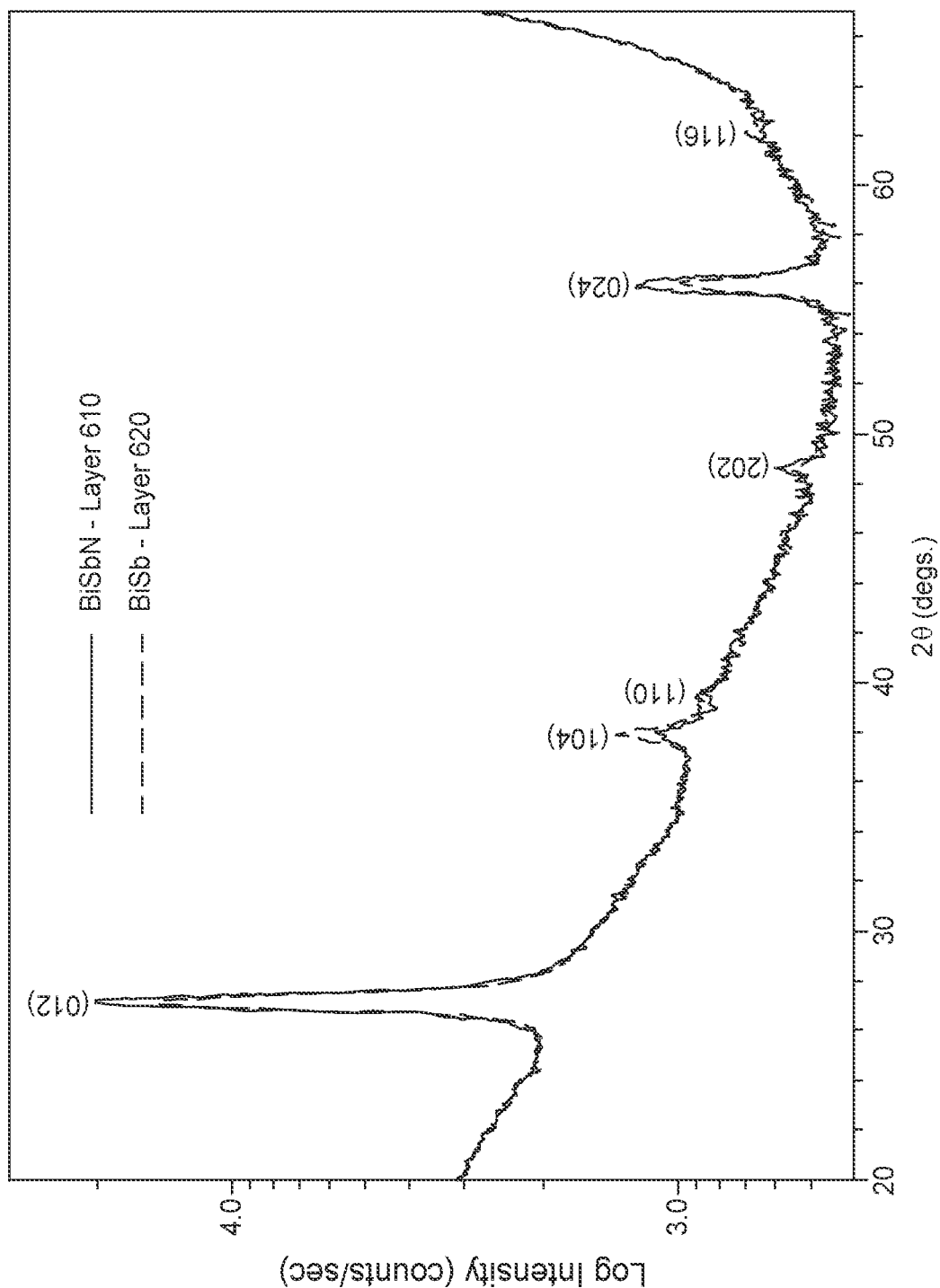
FIG. 6 illustrates 2-theta XRD scans vs. the intensity of the BiSb orientation of a BiSb layer and a BiSbE layer doped with $N_2$.

FIG. 6 illustrates 2-theta XRD scans vs. logarithm of the intensity of the (012) peak of a first doped BiSbE layer 610 and an un-doped BiSb layer 620. The doped BiSbE layer is doped with nitrogen. The doped BiSbE layer 610 has a thickness of about 100 Å, wherein the doped BiSbE layer 610 is doped with $N_2$ at about 1-4 at. %. The un-doped BiSb layer 620 comprised has a thickness of about 100 Å.

Due to the $N_2$ doping of the doped BiSbE layer 610, the doped BiSbE layer 610 has a smoother film texture compared to un-doped BiSb layer 620 because during formation of the doped BiSbE layer 610, the dopant gas disrupts the grain growth in the doped BiSbE layer 610, which reduces the grain size of the doped BiSbE layer 610, resulting in a smooth surface for improved topological insulator (TI) performance (i.e., the grain size of doped BiSbE layer 610 is smaller than the grain size of un-doped BiSb layer 620). The smaller grain size of the doped BiSbE layer 610 results in an increased reflectance at the desired peaks (012) and (024), and a decreased reflectance at non-desired peaks (104), (110), (202), and (116).

Figure 7:
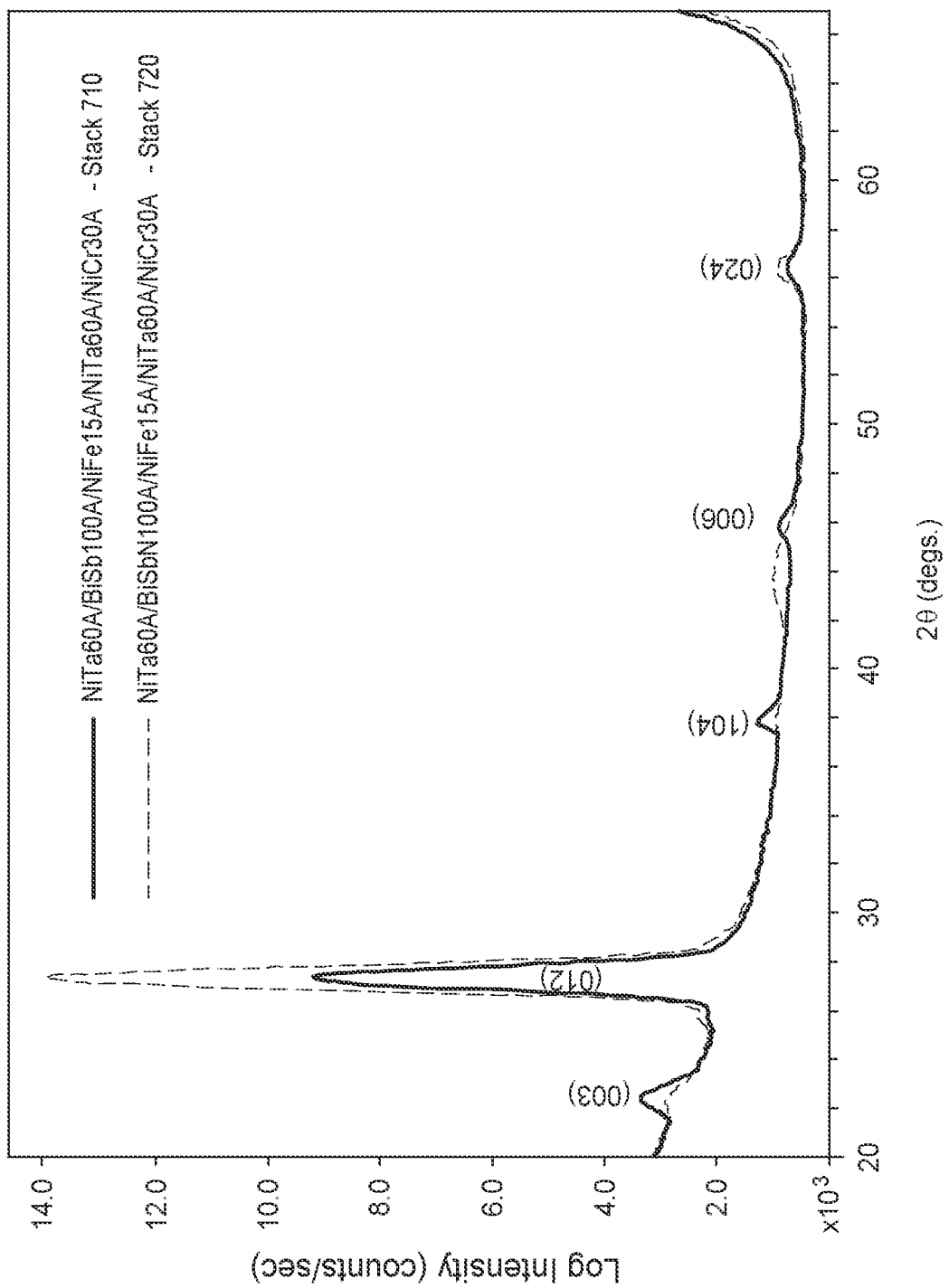
FIG. 7 illustrates 2-theta XRD scans vs. logarithm of the intensity of the BiSb orientation of a BiSb stack and a BiSbE stack doped with $N_2$.

FIG. 7 illustrates 2-theta XRD scans vs. the intensity of the BiSb orientation of two stacks 710 and 720. Stack 710 comprises a seed layer of NiTa-silicide layer formed to a thickness of about 60 Å, a non-doped BiSb layer formed to a thickness of about 100 Å, a NiFe layer formed to a thickness of 15 Å, an interlayer of NiTa formed to a thickness of about 60 Å, and a cap layer of NiCr formed to a thickness of about 30 Å. Stack 720 comprises a seed layer of NiTa-silicide layer formed to a thickness of about 60 Å, a doped BiSbE layer formed to a thickness of about 100 Å, such as the BiSbE layer 304 of FIGS. 3A and 3B, a NiFe layer formed to a thickness of 15 Å, an interlayer of NiTa formed to a thickness of about 60 Å, and a cap layer of NiCr formed to a thickness of about 30 Å. The dopant for the doped BiSbE layer is nitrogen. Note that stacks 710 and 720 are not the MTJ, seed layer, interlayer structures of FIGS. 3A and 3B, but rather, simple stacks that illustrate the benefits of using a doped BiSbE layer rather than an undoped BiSb layer. The doped BiSbE layer comprises a plurality of BiSb lamella layers and a plurality of dopant lamella layers. It is to be understood that while the dopant is shown to be nitrogen, other dopants are contemplated such as hydrogen.

Similar to FIG. 6, stack 720 has a smoother film texture compared to stack 610 because doping the BiSbE layer with a non-reactive gas such as $N_2$ results in a smaller grain size (i.e. the grain size of stack 720 is smaller than the grain size of stack 710). The smaller grain size of the doped stack 720 results in an increased reflectance at the desired peaks (012) and (024), and a decreased reflectance at non-desired peaks (003), (104), and (006). As shown in the dashed line, the (012) peak is significantly higher and more pronounced for stack 720 as compared to stack 710, with the only difference between stack 710 and stack 720 being the doped BiSbE layer in stack 720 while stack 710 has an un-doped BiSb layer.

Figure 8A:
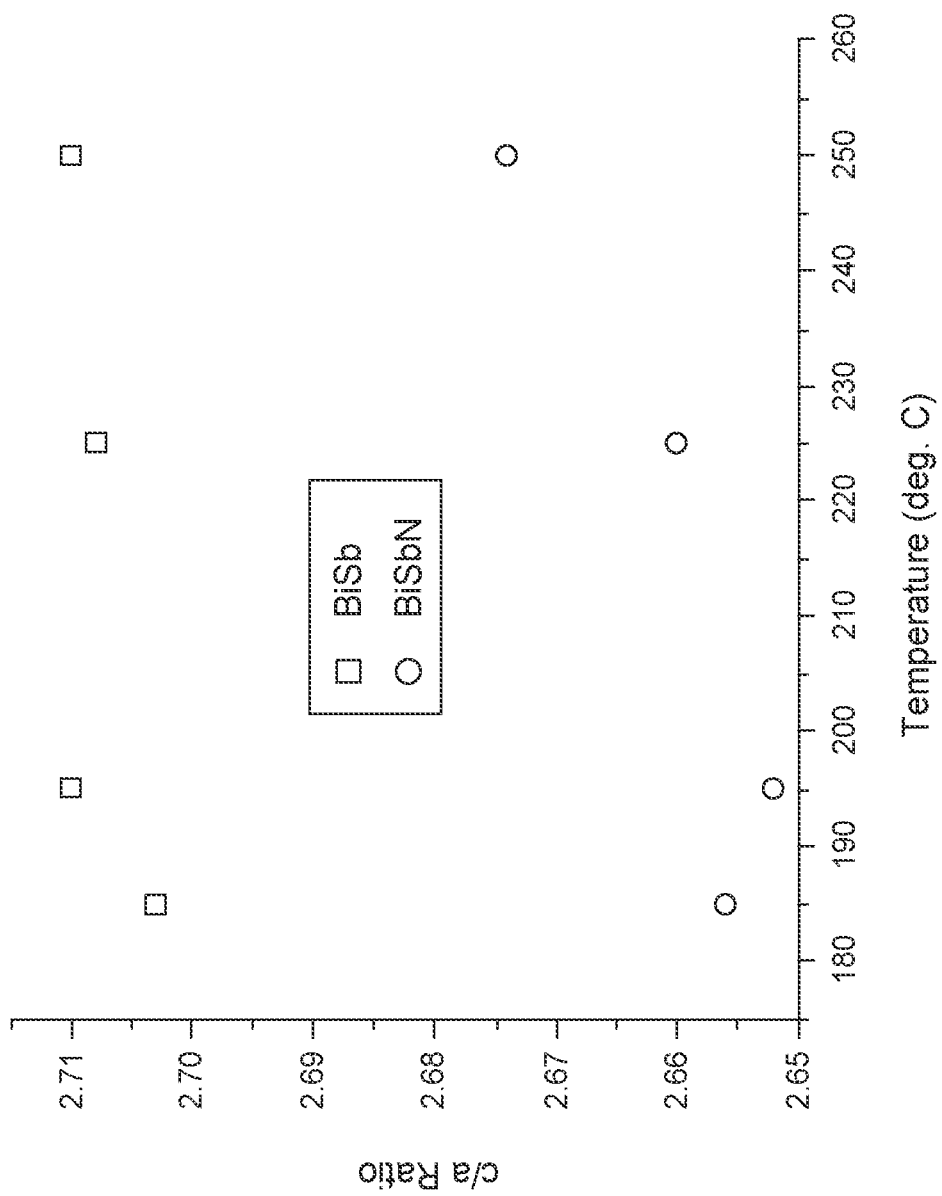
FIG. 8A illustrates c/a ratio vs. temperature of a BiSb layer and a BiSbE layer doped with $N_2$ (BiSbN).

FIG. 8A illustrates a c-axis lattice parameter to a-axis lattice parameter (c/a) ratio vs. temperature of an undoped BiSb layer and a doped BiSbE layer doped with $N_2$, such as the doped BiSbE layer 304 of FIGS. 3A and 3B. Note that for FIG. 8A, the un-doped BiSb layer and the doped BiSbE layer are simply the layers themselves without other layers of the MTJ SOT discussed above. The c/a ratio of a perfect crystalline is a constant value; however, strain in the crystal lattice can change the c/a ratio. Changes in the c/a ratio can make the lattice of the crystal better suited for a desired seed layer. Thus, by manipulating the c/a ratio, a lattice that encourages smoother film growth of a BiSb layer with a (012) orientation can be achieved.

As illustrated in FIG. 8A, eight coupons, four coupons of un-doped BiSb samples and four coupons of doped BiSbE samples doped with $N_2$, were annealed at various temperatures between 185 degrees Celsius (° C.) and 250° C.

The un-doped BiSb coupons may comprise SOT MTJ device 300 of FIG. 3A or the SOT MTJ device 302 of FIG. 3B. The un-doped BiSb coupons were formed in a chamber with Kr sputtering gas at a flow rate of 5 sccm. The doped BiSbE coupons were formed in a chamber with a mixture of Kr and $N_2$ sputtering gas. An example of one of the present embodiments was formed in a chamber with a sputtering gas mixture of 1:2 of Kr:$N_2$ (i.e., the flow rate of Kr was 5 sccm and the flow rate of $N_2$ was 10 sccm). In other embodiments, the sputtering mixture may be a 1:1 mixture of Kr and $N_2$ (for example the flow rate of Kr is equal to 5 sccm and the flow rate of a non-reactive doping gas is equal to 5 sccm). Comparing the BiSb coupons to the $N_2$ doped BiSbE coupons, it can be seen that $N_2$ doped BiSbE film (BiSbN) has significantly lower c/a ratios as compared to un-doped BiSb film. A more detailed analysis of the c/a ratio and additional film properties is discussed below in FIGS. 8B and 8C.

FIG. 8B illustrates a chart containing the data points of FIG. 8A as well as additional un-doped BiSb and doped BiSbE film properties at specific annealing temperatures. Films were selected from the thickness range 100-130A to be most sensitive to changes in surface conduction state. Coupon S1-5, an un-doped BiSb film, and coupon S2-1, a $N_2$ doped BiSbE film, were annealed at a temperature of 185° C. for 60 minutes. The c/a ratio of S1-5 was 2.703 and the c/a ratio of S2-1 was 2.656. Coupon S1-6, an un-doped BiSb film, and coupon S2-5, a $N_2$ doped BiSbE film, were annealed at a temperature of 195° C. for 60 minutes. The c/a ratio of S1-5 was 2.710 and the c/a ratio of S2-1 was 2.652. Coupon S1-1, an un-doped BiSb film, and coupon S2-2, a $N_2$ doped BiSbE film, were annealed at a temperature of 225° C. for 60 minutes. The c/a ratio of S1-5 was 2.708 and the c/a ratio of S2-1 was 2.660. Coupon S1-3, an un-doped BiSb film, and coupon S2-3, a $N_2$ doped BiSbE film, were annealed at a temperature of 250° C. for 75 minutes. The c/a ratio of S1-5 was 2.710 and the c/a ratio of S2-1 was 2.674. Thus, as shown in FIGS. 8A and 8B, the c/a ratio decreased significantly for the doped BiSbE coupons (S2-1, S2-5, S2-2, S2-3) compared to the un-doped BiSb coupons (S1-5, S1-6, S1-4, S1-3). For example, the $N_2$ doped BiSbE coupons, S2-1, S2-5, S2-2, and S2-3, each had a c/a ratio of less than 2.7, whereas the un-doped BiSb coupons, S1-5, S1-6, S1-4, S1-3, each had a c/a ratio of greater than 2.7.

FIG. 8C illustrates a chart containing un-doped BiSb and doped BiSbE film properties before and after annealing at various temperatures to determine whether doping an un-doped BiSb film would negatively affect TI properties and cause the doped BiSbE film to be thermally unstable. To test the thermal stability of doped BiSbE films, eight coupons, four coupons of un-doped BiSb samples (S13-S16) and four coupons of doped BiSbE samples (S21-25), were analyzed for the change in resistance before and after annealing (Rs Delta/Mean) at various temperatures. It was found that both the un-doped BiSb coupons (S13-S16) and the doped BiSbE coupons (S21-25) experienced a change in resistance between about −5% to +5%, which is within the normal standard of error (i.e. no mathematically significant change in resistance was seen in the samples post annealing). Therefore, it is shown that doping BiSbE films with $N_2$ during formation is effective at reducing grain size and improving film texture while also retaining thermal stability.

Figure 9A:
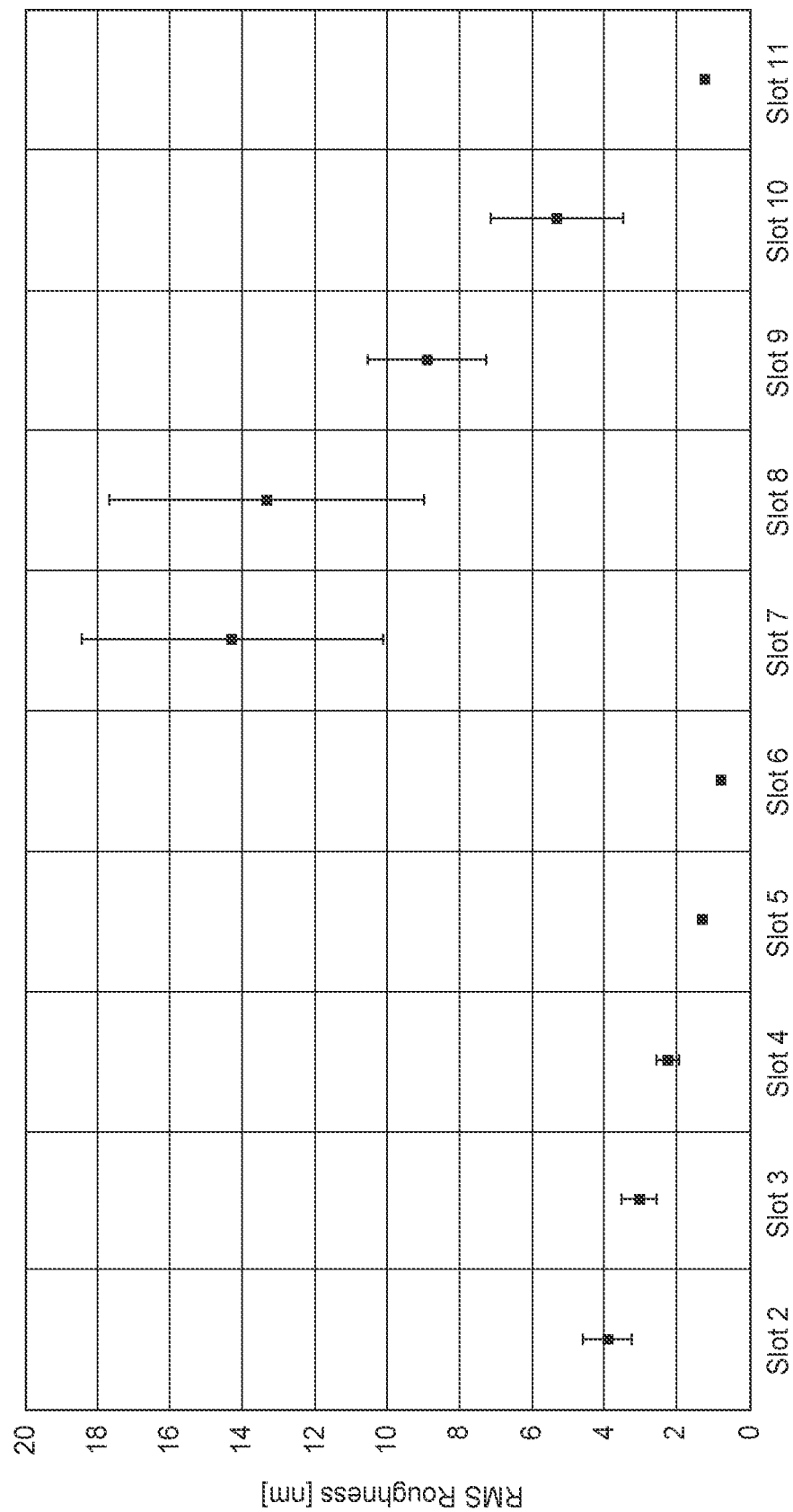
FIG. 9A illustrates an RMS roughness chart comparing a BiSb layer to a BiSbE layer doped with $N_2$.

FIG. 9A illustrates a root mean square (RMS) roughness chart comparing an un-doped BiSb layer that has not been doped to a doped BiSbE layer doped with $N_2$, such as the doped BiSbE layer 304 of FIGS. 3A and 3B. Slots 7-11 each represent an un-doped BiSb layer having a certain thickness. Slots 2-6 correspond to doped BiSbE layers that were formed under process conditions of 750V/150 mA with a sputtering gas of 5 sccm Kr (Kr5) and 10 sccm $N_2$ (N10). Slots 7-11 correspond to un-doped BiSb layers formed under similar process conditions of 750V/150 mA with a sputtering gas of 5 sccm Kr (Kr5) (i.e., the sputtering gas did not contain a non-reactive dopant gas). FIG. 9B illustrates a roughness summary table of the RMS roughness chart of FIG. 9A.

With respect to slots 2 & 7, slot 2 and slot 7 were both formed with a deposition time of 300 seconds (s); however, slot 7 having a thickness of about 576 angstrom (Å), is thicker than slot 2 having a thickness of about 488 Å. This is because the un-doped BiSb layer of slot 7 was deposited at a faster rate of about 1.92 angstrom per second (Å/s), as compared to the doped BiSbE layer of slot 2 which had a deposition rate of about 1.627 Å/s. Additionally, slot 7 having an RMS roughness of 14.28 is rougher than slot 2 having an RMS roughness of 3.92.

With respect to slots 3 & 8, slot 3 and slot 8 were both formed with a deposition time of 240 s; however, slot 8 having a thickness of 481 Å, is thicker than slot 3 having a thickness of 404 Å. This is because the un-doped BiSb layer of slot 8 was deposited at a faster rate of about 2.004 Å/s, as compared to the doped BiSbE layer of slot 3 which had a deposition rate of about 1.683 Å/s. Additionally, slot 8 having an RMS roughness of 13.33 is rougher than slot 3 having an RMS roughness of 3.03.

With respect to slots 4 & 9, slot 4 and slot 9 were both formed with a deposition time of 180 s; however, slot 9 having a thickness of 350 Å, is thicker than slot 4 having a thickness of 298 Å. This is because the un-doped BiSb layer of slot 9 was deposited at a faster rate of about 1.944 Å/s, as compared to the doped BiSbE layer of slot 4 which had a deposition rate of about 1.656 Å/s. Additionally, slot 9 having an RMS roughness of 8.89 is rougher than slot 4 having an RMS roughness of 2.24.

With respect to slots 5 & 10, slot 5 and slot 10 were both formed with a deposition time of 120 s; however, slot 10 having a thickness of 236 Å, is thicker than slot 5 having a thickness of 198 Å. This is because the un-doped BiSb layer of slot 10 was deposited at a faster rate of about 1.967 Å/s, as compared to the doped BiSbE layer of slot 5 which had a deposition rate of about 1.650 Å/s. Additionally, slot 10 having an RMS roughness of 5.31 is rougher than slot 4 having an RMS roughness of 1.27.

With respect to slots 6 & 11, slot 6 and slot 11 were both formed with a deposition time of 60 s; however, slot 11 having a thickness of 125 Å, is thicker than slot 6 having a thickness of 102 Å. This is because the un-doped BiSb layer of slot 11 was deposited at a faster rate of about 2.083 Å/s, as compared to the doped BiSbE layer of slot 6 which had a deposition rate of about 1.700 Å/s. Additionally, slot 11 having an RMS roughness of 1.21 is rougher than slot 6 having an RMS roughness of 0.78.

Thus, it is clearly illustrated that $N_2$ doping reduces both film thickness and the grain size by disrupting the continuous growth of the BiSb grain resulting in a slower growing film with a lower RMS roughness, thereby improving interface quality between the BiSb layer and surrounding layers and inhibiting undesirable antimony migration.

Figure 9C:
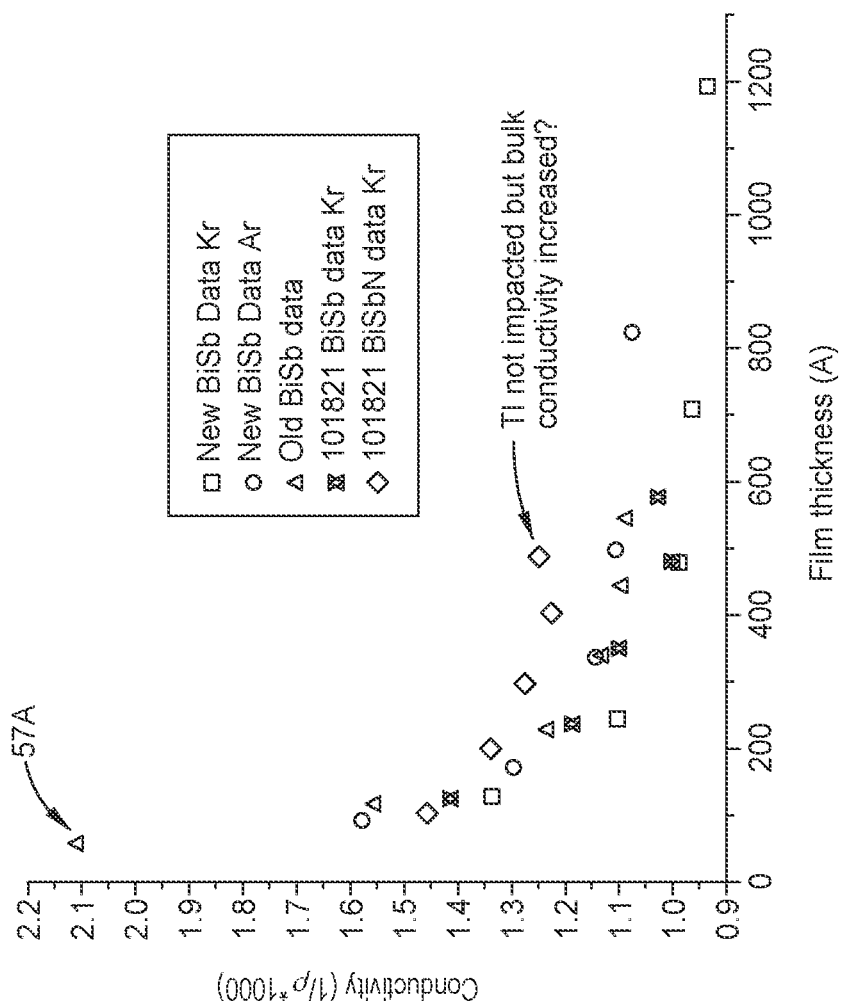
FIG. 9C illustrates film thickness of various BiSb films vs. conductivity.

FIG. 9C illustrates film thickness of various BiSb film types (i.e., both un-doped and doped) vs. conductivity. The conductivity (1/resistivity ($\rho$)*1000) of five different BiSb film types were measured, where each of the five different BiSb film types had five coupons of various thicknesses. For each of the five different BiSb film types, one coupon had a deposition time of 300 s, a second coupon had a deposition time of 240 s, a third coupon had a deposition time of 180 s, a fourth coupon had a deposition time of 120 s, and a fifth coupon had a deposition time of 60 s. As such, each of the 5 coupons of each of the 5 different BiSb films had various thicknesses because, as described above, process conditions such as deposition time, annealing temperature, V/mA, and the presence of a dopant element during formation of the film affect the thickness of a film.

The "Old BiSb data" illustrates the conductivity vs. film thickness for prior art un-doped BiSb films. The "101821 BiSb data Kr" illustrates the conductivity vs. film thickness of un-doped BiSb coupons of slots 6-11 of FIGS. 9A and 9B. The "101821 BiSbN data Kr" illustrates the conductivity vs. film thickness of the $N_2$ doped BiSbE coupons of slots 1-5 of FIGS. 9A and 9B. The doped BiSbE coupons show an increase in the bulk conductivity without impacting TI.

Figure 10A:
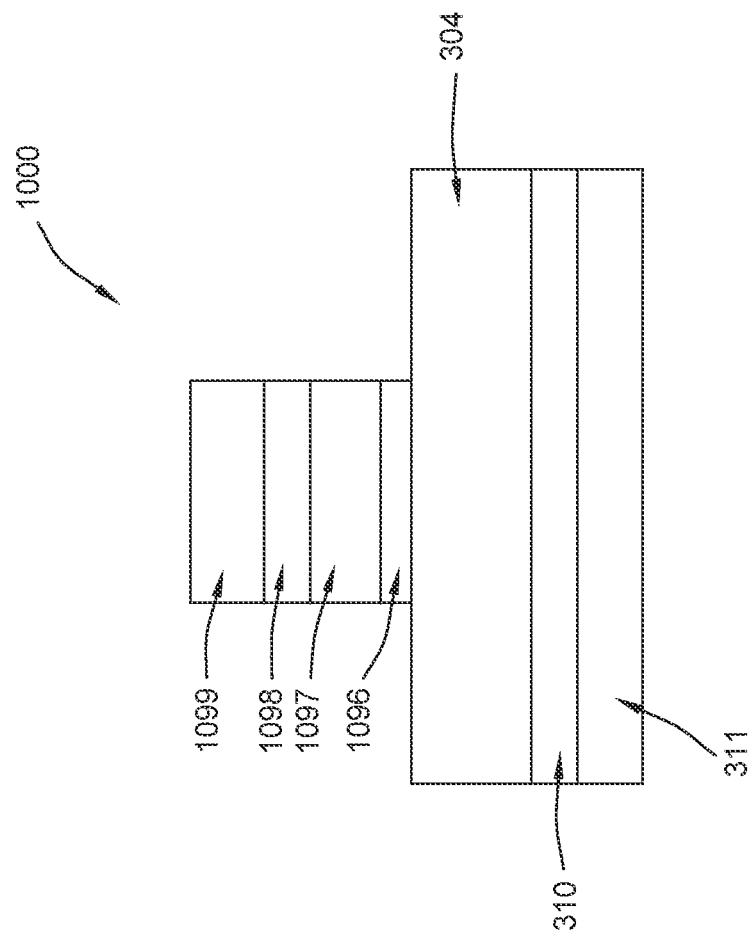
FIG. 10A is a schematic cross-sectional view of a SOT device for use in a MAMR write head, such as the read/write head of the drive of FIG. 1 or other suitable media drives.

FIG. 10A is a schematic cross-sectional view of a SOT device 1000 for use in a MAMR write head, usable for example as part of the read/write head of the drive 100 of FIG. 1 or other suitable magnetic media drives. The SOT device 1000 comprises a doped BiSbE layer 304 with a (012) orientation formed over a seed layer 310 formed over a substrate 311, such as the $N_2$ doped BiSbE layer 304 and the seed layer 310 of FIGS. 3A and 3B. A spin torque layer (STL) 1097 is formed over the BiSbE layer 304. The STL 1097 comprises a ferromagnetic material such as one or more layers of CoFe, CoIr, NiFe, and CoFeX alloy wherein X=B, Ta, Re, or Ir.

In certain embodiments, an electrical current shunt block layer 1096 is disposed between the BiSbE layer 304 and the STL 1097. The electrical current shunt blocking layer 1096 reduces electrical current from flowing from the BiSbE layer 304 to the STL 1097 but allows spin orbital coupling of the BiSbE layer 304 and the STL 1097. In certain embodiments, the electrical current shunt blocking layer 1096 comprises a magnetic material which provides greater spin orbital coupling between the BiSbE layer 304 and the STL 1097 than a non-magnetic material. In certain embodiments, the electrical current shunt blocking layer 1096 comprises FeCo, FeCoM, FeCoMO, FeCoMMeO, FeCoM/MeO multilayer stack, FeCoMNiMnMgZnFeO, FeCoM/NiMnMgZnFeO multilayer stack, multiple layers/stacks thereof, or combinations thereof in which M is one or more of B, Si, P, Al, Hf, Zr, Nb, Ti, Ta, Mo, Mg, Y, Cu, Cr, and Ni, and Me is one or more of Si, Al, Hf, Zr, Nb, Ti, Ta, Mg, Y, or Cr. In certain embodiments, the electrical current shunt blocking layer 1096 is formed to a thickness from about 10 Å to about 100 Å. In certain aspects, an electrical current shunt blocking layer 1096 having a thickness of over 100 Å may reduce spin orbital coupling of the BiSbE layer 304 and the STL 1097. In certain aspects, an electrical current shunt blocking layer having a thickness of less than 10 Å may not sufficiently reduce electrical current from BiSbE layer 304 to the STL 1097.

In certain embodiments, additional layers are formed over the STL 1097 such as a spacer layer 1098 and a pinning layer 1099. The pinning layer 1099 can partially pin the STL 1097. The pinning layer 1099 comprises a single or multiple layers of PtMn, NiMn, IrMn, IrMnCr, CrMnPt, FeMn, other antiferromagnetic materials, or combinations thereof. The spacer layer 1098 comprises single or multiple layers of magnesium oxide, aluminum oxide, other non-magnetic materials, or combinations thereof.

Figure 10C:
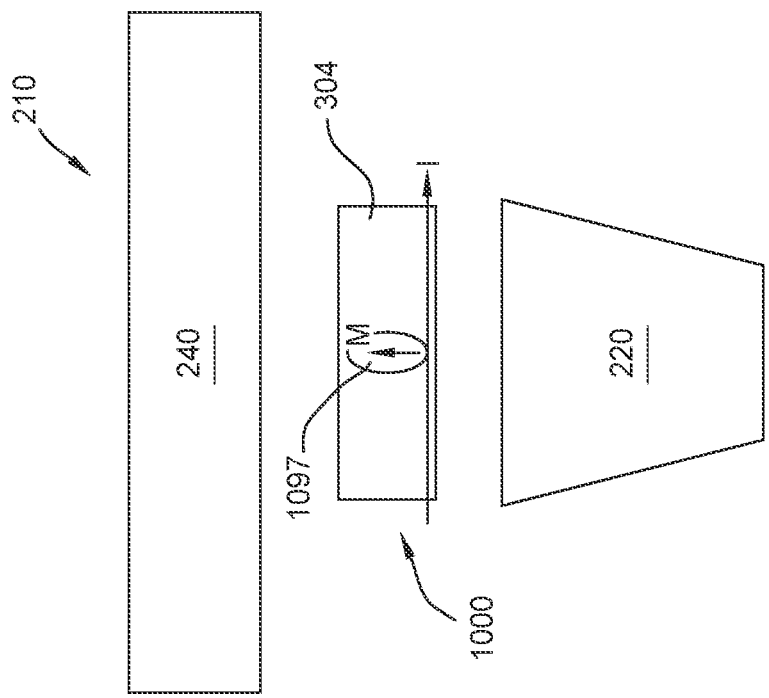
FIGS. 10B and 10C are schematic MFS views of certain embodiments of a portion of a MAMR write head with a SOT device of FIG. 10A.
Figure 10B:
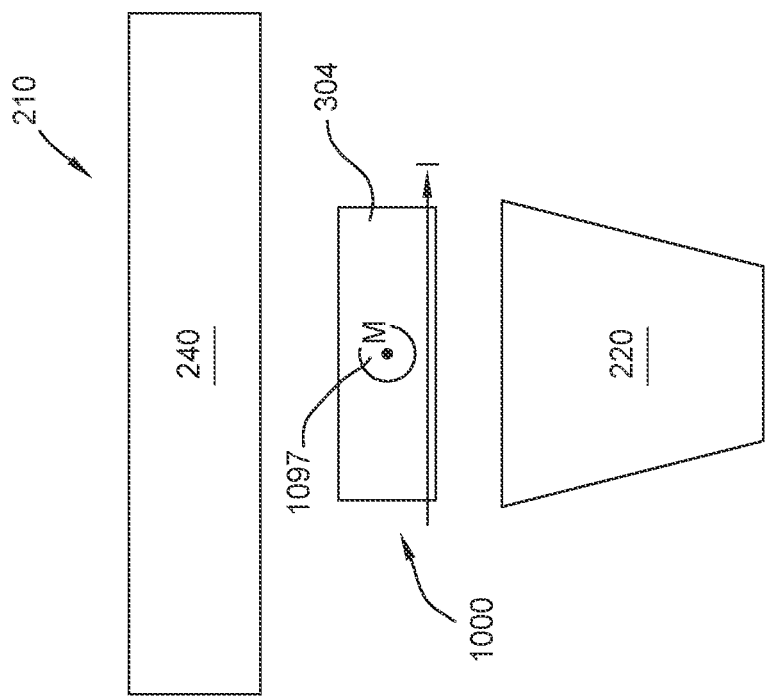

FIGS. 10B and 10C are schematic MFS views of certain embodiments of a portion of a MAMR write head 210 with a SOT device 1000 of FIG. 10A. The MAMR write head 210 can be the write head FIG. 2 or other suitable write heads in the disk drive 100 of FIG. 1 or other suitable magnetic media drives such as tape drives. The MAMR write head 210 includes a main pole 220 and a trailing shield 240 in a track direction. The SOT device 1000 is disposed in a gap between the main pole and the trailing shield 240.

During operation, charge current through a doped BiSbE layer or layer stack 304 acting as a spin Hall layer generates a spin current in the doped BiSbE layer. The spin orbital coupling of the doped BiSbE layer and STL 1097 causes switching or precession of magnetization of the STL 1097 by the spin orbital coupling of the spin current from the doped BiSbE layer 304. Switching or precession of the magnetization of the STL 1097 can generate an assisting AC and/or DC field to the write field. Energy assisted write heads based on SOT have multiple times greater power efficiency in comparison to MAMR write heads based on spin transfer torque. As shown in FIG. 10B, an easy axis of a magnetization direction of the STL 1097 is perpendicular to the MFS from shape anisotropy of the STL 1097, from the pinning layer 1099 of FIG. 10A, and/or from hard bias elements proximate the STL 1097. As shown in FIG. 10C, an easy axis of a magnetization direction of the STL 1097 is parallel to the MFS from shape anisotropy of the STL 1097, from the pinning layer 1099 of FIG. 10A, and/or from hard bias elements proximate the STL 1097.

FIG. 11 is a schematic cross-sectional view of a SOT MTJ 1101 used as a MRAM device 1100. The MRAM device 1100 comprises a reference layer (RL) 1110, a spacer layer 1120 over the RL 1110, a recording layer 1130 over the spacer layer 1120, a seed layer or buffer layer 310 over an electrical current shunt block layer 1140 which is disposed over the recording layer 1130, and a doped BiSbE layer or layer stack 304 over the seed layer or buffer layer 310. The doped BiSbE layer 304 and the seed layer or buffer layer 310 may be the doped BiSbE layer 304 and the seed layer 310 of FIGS. 3A and 3B.

The RL 1110 comprises single or multiple layers of CoFe, other ferromagnetic materials, and combinations thereof. The spacer layer 1120 comprises single or multiple layers of magnesium oxide, aluminum oxide, other dielectric materials, or combinations thereof. The recording layer 1130 comprises single or multiple layers of CoFe, NiFe, other ferromagnetic materials, or combinations thereof.

As noted above, in certain embodiments, the electrical current shunt block layer 1140 is disposed between the seed layer or buffer layer 310 and the recording layer 1130. The electrical current shunt blocking layer 1140 reduces electrical current from flowing from the doped BiSbE layer 304 to the recording layer 1130 but allows spin orbital coupling of the doped BiSbE layer 304 and the recording layer 1130. For example, writing to the MRAM device can be enabled by the spin orbital coupling of the doped BiSbE layer and the recording layer 1130, which enables switching of magnetization of the recording layer 1130 by the spin orbital coupling of the spin current from the doped BiSbE layer 304. In certain embodiments, the electrical current shunt blocking layer 1140 comprises a magnetic material which provides greater spin orbital coupling between the doped BiSbE layer 304 and the recording layer 1130 than a non-magnetic material. In certain embodiments, the electrical current shunt blocking layer 1140 comprises FeCoM, FeCoMO, FeCoMMeO, FeCoM/MeO stack, FeCoMN-iMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 1100 of FIG. 11 may include other layers, such as pinning layers, pinning structures (e.g., a synthetic antiferromagnetic (SAF) pinned structure), electrodes, gates, and other structures. Other MRAM devices besides the structure of FIG. 11 can be formed utilizing a doped BiSbE layer 304 with a (012) orientation over a seed layer 310 to form a SOT MTJ 1101.

Figure 12A:
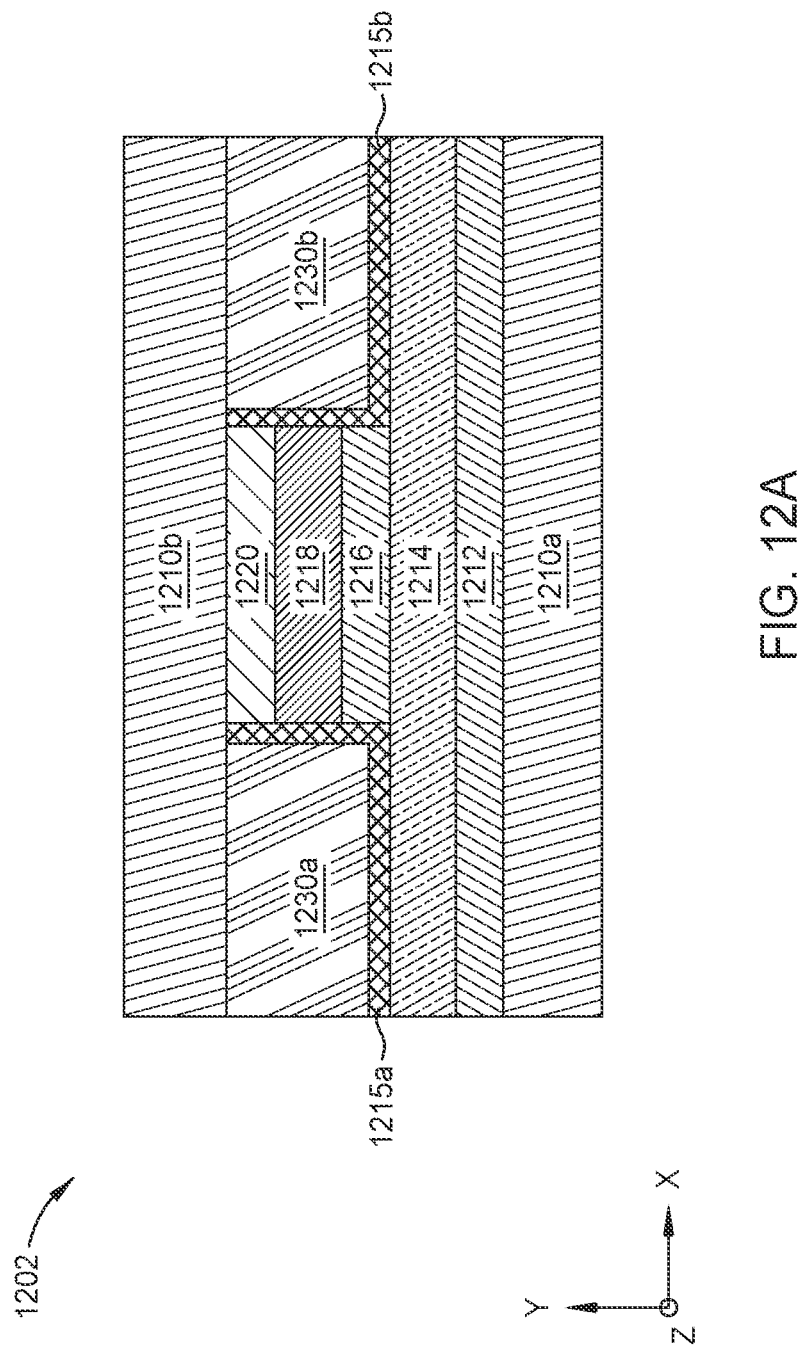
FIGS. 12A and 12B are schematic media facing surface (MFS) view of a pinned doped BiSbE based sensor according to various embodiments.
Figure 12B:
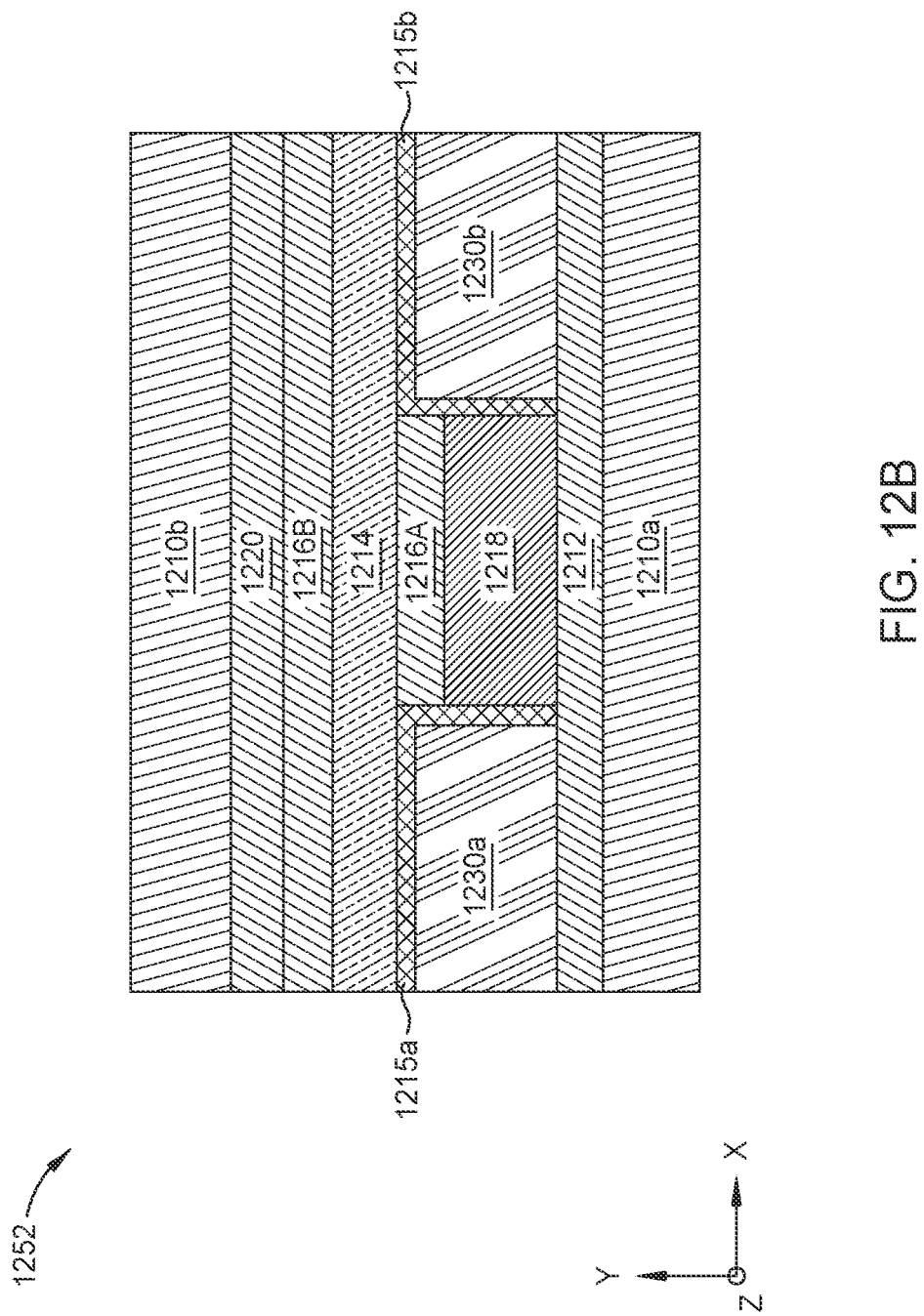

FIGS. 12A and 12B are schematic media facing surface (MFS) view of a pinned doped BiSbE based sensor according to various embodiments. FIG. 12A illustrates a top pinned sensor 1202 that includes a first shield 1210a, a seed layer 1212 disposed adjacent to and in contact with the first shield 1210a, a doped BiSbE layer 1214 adjacent to and in contact with the seed layer 1212, an interlayer 1216 adjacent to and in contact with the doped BiSbE layer 1214, a MTJ structure 1218 adjacent to and in contact with the interlayer 1216, a capping layer 1220 disposed adjacent to and in contact with the MTJ structure 1218, and a second shield 1210b disposed adjacent to and in contact with the capping layer 1220. The sensor 1202 further comprises a first bias 1230a, and a second bias 1230b, wherein a first insulation layer 1215a separates the first bias 1230a from the interlayer 1216, the MTJ structure 1218, and the capping layer 1220, and a second insulation layer 1215b separates the second bias 1230b from the interlayer 1216, the MTJ structure 1218, and the capping layer 1220.

FIG. 12B illustrates a bottom pinned sensor 1252. The sensor 1252 comprises a first shield 1210a, a seed layer 1212 disposed adjacent to and in contact with the first shield 1210a, a MTJ structure 1218 disposed adjacent to and in contact with the seed layer 1212, a first interlayer 1216a disposed adjacent to and in contact with the MTJ structure 1218, a doped BiSbE layer 1214 disposed adjacent to and in contact the first interlayer 1216a, a second interlayer 1216b disposed adjacent to and in contact with the doped BiSbE layer 1214, a capping layer 1220 disposed adjacent to and in contact with the second interlayer 1216b, and a second shield 1210b, disposed adjacent to and in contact with the capping layer 1220.

By doping a BiSb layer with a non-reactive gas, grain size is decreased improving film texture and reducing undesirable antimony migration.

In one embodiment, a method of forming a spin-orbit torque (SOT) device, comprises: disposing a substrate in a sputtering chamber; flowing a sputtering gas into the chamber, the sputtering gas comprising Kr gas and a non-reactive dopant gas; applying a bias to the target; and depositing a bismuth antimony (BiSb) layer on the substrate, wherein the BiSb layer is doped with the non-reactive dopant gas. The BiSb layer doped with the non-reactive dopant gas comprises the non-reactive dopant gas from about 0.5 atomic % to about 5 atomic %. The BiSb layer doped with the non-reactive dopant gas is deposited at a rate of between about 1.6 angstrom per second (A/s) to about 1.7 Å/s. The method further comprises depositing an interlayer on the BiSb layer, wherein the interlayer comprises one or more materials selected from the group consisting of a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous material comprising covalently bonded carbide, oxide, or nitride, an amorphous metallic material, and a layered combination thereof. The sputtering gas into the chamber comprises flowing a first volumetric flow rate of Kr gas into the chamber and flowing a second volumetric flow rate of a non-reactive dopant gas into the chamber. The non-reactive dopant gas is selected from a group consisting of $N_2$, $H_2$, Ne, Xe, Kr, $C_xH_y$, where x and y are numerals, and combinations thereof. The first volumetric flow rate is substantially equal to the second volumetric flow rate. The first volumetric flow rate is less than the second volumetric flow rate.

In another embodiment, a spin-orbit torque (SOT) device, comprising: a substrate; and a bismuth antimony dopant element (BiSbE) layer over the substrate, the BiSbE layer having a (012) orientation, the BiSbE layer comprising: bismuth; antimony; and a non-reactive dopant element, wherein the non-reactive dopant element comprises 0.5 atomic % to about 5 atomic % of the BiSbE layer. The BiSbE layer has a surface roughness of about 0.7 nanometer (nm) to about 4 nm. The BiSbE layer has a c/a ratio of less than 2.7. The BiSbE layer has a thickness of about 100 angstrom (Å) to about 500 Å. The BiSbE layer has a conductivity of about 1.2 1/resistivity*1000 to about 1.4 1/resistivity*1000. The BiSbE layer is deposited by doping the BiSbE layer with the non-reactive dopant gas, the non-reactive dopant gas being selected from a group consisting of Kr, $N_2$, $H_2$, Xe, Ne, $C_xH_y$, where x and y are numerals, and combinations thereof. The SOT device further comprises an intermediate layer disposed on the BiSbE layer, wherein the interlayer comprises one or more materials selected from the group consisting of a tetragonal (001) material, a tetragonal (110) material, a textured B2 (100) material, a textured fcc (100) material, a textured bcc (100) material, an amorphous material and a layered combination thereof.

In yet another embodiment, a method of forming a spin-orbit torque (SOT) device, comprising: disposing a substrate in a sputter chamber; depositing a seed layer over the substrate; depositing a bismuth antimony (BiSb) layer over the seed layer, wherein depositing the BiSb layer comprises doping the BiSb layer with a non-reactive dopant gas selected from a group consisting of $N_2$, $H_2$, Ne, Xe, Kr, $C_xH_y$, where x and y are numerals, and combinations thereof; and depositing an interlayer over the doped BiSb layer. The method further comprises: depositing a spin-torque layer (STL) over the interlayer, wherein the STL comprises a ferromagnetic material selected from a group consisting of CoFe, CoM, Coir, NiFe, and CoFeM, and combinations thereof, wherein M is B, Ta, Re, or Ir. The method, further comprises: depositing a free perpendicular magnetic anisotropy (PMA) layer over the interlayer; depositing an insulation layer over the PMA layer; depositing a reference PMA layer over the insulation layer; and depositing a cap layer over the reference PMA layer.

In yet another embodiment, according to the methods described above, a spin-orbit torque (SOT) magnetic tunnel junction (MTJ) MRAM device may be formed, wherein the SOT MTJ device, comprises: a substrate; a buffer layer formed on the substrate, the buffer layer comprising: a first intermediary layer, wherein the first intermediary layer comprises a material selected from the group of a tetragonal textured (001), (110) material, a textured bcc or B2 (100) material, a textured fcc (100) material, and a textured (100) material; and a bismuth antimony (BiSb) layer having a (012) orientation formed using the method described above over the buffer layer, wherein the BiSb layer comprises: a first Bi layer, wherein the BiSb layer is disposed on the first Bi layer, and depositing a second Bi layer on the BiSb layer, wherein the buffer layer is configured to reduce migration of Sb in the BiSb layer. The buffer layer further comprises an amorphous layer disposed below the first intermediary layer, wherein the amorphous layer comprises a material selected from the group consisting of NiTa, NiFeTa, NiNb, NiW, NiFeW, NiFeHf, CoHfB, CoZrTa, CoFeB, NiFeB, CoB, FeB, and alloy combinations wherein the alloy combinations comprise combinations of elements selected from the group consisting of Ni, Fe, Co, Zr, W, Ta, Hf, Ag, Pt, Pd, Si, Ge, Mn, Al, and Ti. The SOT MTJ device, wherein the buffer layer further comprises a second intermediary layer. The second intermediary layer is a textured bcc (100) material. The second intermediary layer is a textured fcc (100) material. The SOT MTJ device further comprises an interlayer disposed on the BiSb layer, wherein the interlayer comprises a same material as the first intermediary layer. The first and second Bi layers each have a width of about 0 Å to about 10 Å. The first intermediary layer is comprised of the tetragonal (001) or (110) material, wherein the tetragonal (001) or (110) material has an a-axis lattice parameter in the range of about 4.20 Å to about 4.75 Å. The first intermediary layer is comprised of the fcc (100) material, wherein the fcc (100) material has a lattice parameter in the range of about 4.10 Å to about 4.70 Å.

In yet another embodiment, according to the methods described above, a spin-orbit torque (SOT) magnetic tunnel junction (MTJ) MRAM device may be formed, wherein the SOT MTJ device, comprises: a substrate; a buffer layer formed over the substrate, the buffer layer comprising: a textured layer with a (100) orientation; and a first intermediary layer disposed over the textured layer, wherein the first intermediary layer is comprised of a material selected from the group consisting of textured layers of tetragonal (001), tetragonal (110), textured bcc or B2 (100), textured fcc (100), and combinations thereof; a bismuth antimony (BiSb) layer formed using the method described above over the buffer layer, wherein the BiSb layer has a (012) orientation, wherein the buffer layer is configured to reduce diffusion of Sb in the BiSb layer; and an interlayer disposed on the BiSb layer. The buffer layer further comprises an amorphous layer comprising a material selected from the group consisting of NiTa, NiFeTa, NiNb, NiW, NiFeW, NiFeHf, CoHfB, CoZrTa, CoFeB, NiFeB, CoB, FeB, and alloy combinations wherein the alloy combinations comprise combinations of elements selected from the group consisting of Ni, Fe, Co, Zr, W, Ta, Hf, Ag, Pt, Pd, Si, Ge, Mn, Al, and Ti. The amorphous layer is disposed over the substrate; the textured layer is disposed on the amorphous layer; the first intermediary layer is disposed on the textured layer; and the BiSb layer is disposed on the first intermediary layer. The buffer layer further comprises a second intermediary layer, wherein the second intermediary layer has a cubic crystal structure different than the first intermediary layer. The interlayer comprises one or more materials selected from the group consisting of a tetragonal (001) material, a tetragonal (110) material, a textured B2 (100) material, a textured fcc (100) material, a textured bcc (100) material, an amorphous material and a layered combination thereof. The textured layer comprises a material selected from the group consisting of RuAl, Cr at a temperature of about 100° C. or greater, and heated CrX alloys, wherein X is a material selected from the group consisting of Ru, W, Mo, and Ti, wherein X is heated to a temperature of 100° C. or more. The first intermediary layer comprises the tetragonal (001) or (110) material, wherein the tetragonal (001) or (110) material comprises $RuO_2$.

In another embodiment, a spin-orbit torque (SOT) device comprises: a substrate; and a doped bismuth antimony (BiSbE) layer disposed over the substrate, wherein the doped BiSbE layer has a (012) orientation, wherein E is a dopant, and wherein the dopant is present in an amount of between about 0.5 atomic percent and about 5 atomic percent of the doped BiSbE layer. The SOT device is a write head. The SOT device is a read head. The SOT device is a magnetoresistive random access memory (MRAM) device. The doped BiSbE layer has a surface roughness of between about 0.7 nm to about 4 nm. The dopant is selected from the group consisting of $N_2$, $H_2$, $C_xH_y$, where x and y are numerals, and combinations thereof. Wherein the SOT device further comprises a seed layer disposed between the substrate and the doped BiSbE layer, wherein the seed layer comprises an amorphous conditioning layer and a texturing layer. The SOT device further comprises an interlayer disposed over the doped BiSbE layer, wherein the interlayer comprises a migration barrier layer and a texturing layer. The SOT device further comprises a spin torque layer (STL) disposed over the doped BiSbE layer.

In another embodiment, a spin-orbit torque (SOT) device comprises: a substrate; a doped bismuth antimony (BiSbE) layer disposed over the substrate, wherein the doped BiSbE layer has a (012) orientation and wherein E is a dopant; an interlayer disposed over the doped BiSbE layer; and a magnetic tunnel junction (MTJ) stack disposed over the interlayer. The interlayer comprises at least one texturing layer and at least one migration barrier layer, wherein the at least one migration barrier layer is disposed on the doped BiSbE layer, and wherein the MTJ stack is disposed on the at least one texturing layer. The SOT device further comprises a seed layer disposed on the substrate, wherein the doped BiSbE layer is disposed on the seed layer. The seed layer comprises a textured fcc (111) layer. The seed layer has a lattice parameter of between about 3.48 Å and about 3.71

Å. The substrate is a main pole. The substrate is a magnetic shield. The SOT device further comprises a capping layer disposed on the MTJ stack.

In another embodiment, a method of forming a spin-orbit torque (SOT) device comprises: disposing a substrate in a sputtering chamber, wherein the sputtering chamber comprises a sputtering target; flowing a sputtering gas into the sputtering chamber, wherein the sputtering gas comprises an inert gas and a non-reactive dopant gas; applying a bias to the sputtering target; and depositing a doped bismuth antimony (BiSbE) layer over the substrate, wherein E is a dopant from the dopant gas and wherein the doped BiSbE layer has a (012) orientation. The method further comprises forming a magnetic tunnel junction (MTJ) structure over the doped BiSbE layer; and forming a texturing layer and a migration barrier layer over the doped BiSbE layer, wherein the substrate comprises an amorphous conditioning layer. The method further comprises forming a spin torque layer (STL) over the doped BiSbE layer; and forming a texturing layer and a migration barrier layer over the doped BiSbE layer, wherein the substrate comprises an amorphous conditioning layer.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
   a substrate; and
   a doped bismuth antimony (BiSbE) layer disposed over the substrate, wherein the doped BiSbE layer has a (012) orientation, wherein E is a dopant, and wherein the dopant is present in an amount of between about 0.5 atomic percent and about 5 atomic percent of the doped BiSbE layer.

2. The SOT device of claim 1, wherein the SOT device is a write head.

3. The SOT device of claim 1, wherein the SOT device is a read head.

4. The SOT device of claim 1, wherein the SOT device is a magnetoresistive random access memory (MRAM) device.

5. The SOT device of claim 1, wherein the doped BiSbE layer has a surface roughness of between about 0.7 nm to about 4 nm.

6. The SOT device of claim 1, wherein the dopant is selected from the group consisting of $N_2$, $H_2$, $C_xH_y$, where x and y are numerals, and combinations thereof.

7. The SOT device of claim 1, further comprising a seed layer disposed between the substrate and the doped BiSbE layer, wherein the seed layer comprises an amorphous conditioning layer and a texturing layer.

8. The SOT device of claim 1, further comprising an interlayer disposed over the doped BiSbE layer, wherein the interlayer comprises a migration barrier layer and a texturing layer.

9. The SOT device of claim 1, further comprising a spin torque layer (STL) disposed over the doped BiSbE layer.

10. A spin-orbit torque (SOT) device, comprising:
    a substrate; and
    a doped bismuth antimony (BiSbE) layer disposed over the substrate, the doped BiSbE layer having a (012) orientation, wherein E is a dopant, wherein the dopant is present in an amount of between about 0.5 atomic percent and about 5 atomic percent of the doped BiSbE layer, and wherein the dopant is selected from the group consisting of $N_2$, $H_2$, $C_xH_y$, where x and y are numerals, and combinations thereof.

11. The SOT device of claim 10, wherein the SOT device is a write head.

12. The SOT device of claim 10, wherein the SOT device is a read head.

13. The SOT device of claim 10, wherein the SOT device is a magnetoresistive random access memory (MRAM) device.

14. The SOT device of claim 10, wherein the doped BiSbE layer has a surface roughness of between about 0.7 nm to about 4 nm.

15. The SOT device of claim 10, further comprising a seed layer disposed between the substrate and the doped BiSbE layer, wherein the seed layer comprises an amorphous conditioning layer and a texturing layer.

16. The SOT device of claim 10, further comprising an interlayer disposed over the doped BiSbE layer, wherein the interlayer comprises a migration barrier layer and a texturing layer.

17. The SOT device of claim 10, further comprising a spin torque layer (STL) disposed over the doped BiSbE layer.

18. A spin-orbit torque (SOT) device, comprising:
    a substrate;
    a doped bismuth antimony (BiSbE) layer disposed over the substrate, the doped BiSbE layer having a (012) orientation, wherein E is a dopant, and wherein the dopant is present in an amount of between about 0.5 atomic percent and about 5 atomic percent of the doped BiSbE layer; and
    a seed layer disposed between the substrate and the doped BiSbE layer, the seed layer comprising an amorphous conditioning layer and a texturing layer.

19. The SOT device of claim 18, wherein the SOT device is a write head.

20. The SOT device of claim 18, wherein the SOT device is a read head.

21. The SOT device of claim 18, wherein the SOT device is a magnetoresistive random access memory (MRAM) device.

22. The SOT device of claim 18, wherein the dopant is selected from the group consisting of $N_2$, $H_2$, $C_xH_y$, where x and y are numerals, and combinations thereof.

23. The SOT device of claim 18, further comprising:
    an interlayer disposed over the doped BiSbE layer, wherein the interlayer comprises a migration barrier layer and a texturing layer; and
    a spin torque layer (STL) disposed over the doped BiSbE layer.

* * * * *